(12) United States Patent
Jung et al.

(10) Patent No.: US 12,716,015 B2
(45) Date of Patent: Aug. 25, 2026

(54) DISPLAY DEVICE AND METHOD OF MANUFACTURING THE SAME

(71) Applicant: Samsung Display Co., LTD., Yongin-si (KR)

(72) Inventors: Min Kyoung Jung, Yongin-si (KR); Ji Hoon Kim, Yongin-si (KR); Eun Mi Seo, Yongin-si (KR); Sung Guk An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/318,036

(22) Filed: May 16, 2023

(65) Prior Publication Data

US 2024/0067849 A1 Feb. 29, 2024

(30) Foreign Application Priority Data

Aug. 23, 2022 (KR) ........................ 10-2022-0105508

(51) Int. Cl.
*C09J 9/00* (2006.01)
*H05K 5/03* (2006.01)

(52) U.S. Cl.
CPC . *C09J 9/00* (2013.01); *H05K 5/03* (2013.01)

(58) Field of Classification Search
CPC .... H05K 5/03; H05K 5/0018; H05K 7/20954; H05K 2201/10128
See application file for complete search history.

(56) References Cited

U.S. PATENT DOCUMENTS

| | | | | |
|---|---|---|---|---|
| 10,056,547 | B2 * | 8/2018 | Nakagawa | G02F 1/133305 |
| 10,411,219 | B2 * | 9/2019 | Sung | H10K 71/00 |
| 11,614,841 | B2 * | 3/2023 | Kishimoto | G06F 1/1652 345/174 |
| 11,925,062 | B2 * | 3/2024 | Han | H10K 59/871 |
| 12,377,498 | B2 * | 8/2025 | Han | B32B 7/12 |
| 2012/0291837 | A1 * | 11/2012 | Lin | H01R 4/04 156/289 |
| 2017/0062537 | A1 * | 3/2017 | Kim | H10K 59/123 |
| 2018/0074612 | A1 * | 3/2018 | Shiojiri | H05K 3/107 |

(Continued)

FOREIGN PATENT DOCUMENTS

| | | |
|---|---|---|
| JP | 7064533 | 5/2022 |
| KR | 10-2019-0032686 | 3/2019 |

(Continued)

*Primary Examiner* — Rockshana D Chowdhury
*Assistant Examiner* — Douglas R Burtner
(74) *Attorney, Agent, or Firm* — Lerner David LLP

(57) ABSTRACT

A display device includes a display panel including a first surface and a second surface opposite to the first surface, a polarizing member disposed on the first surface of the display panel, a window member disposed on the polarizing member, and a first adhesive member disposed between the window member and the polarizing member and including an ultraviolet light absorber. A side surface of the display panel, a side surface of the polarizing member, and a side surface of the first adhesive member have a first surface roughness, an upper surface of the first adhesive member has a second surface roughness less than the first surface roughness, and the side surface of the display panel, the side surface of the polarizing member, and the side surface of the first adhesive member are aligned at a boundary.

11 Claims, 17 Drawing Sheets

(56) References Cited

U.S. PATENT DOCUMENTS

2018/0159087 A1* 6/2018 Yug ...................... B23K 26/402
2019/0243041 A1 8/2019 Takarada et al.
2020/0139671 A1* 5/2020 Cao ........................ B32B 17/06
2020/0333845 A1* 10/2020 Yug ...................... G06F 1/1652
2021/0255667 A1* 8/2021 Lee ...................... G06F 1/1626
2021/0300010 A1* 9/2021 Choi ..................... B32B 27/281
2022/0043538 A1* 2/2022 Kishimoto .............. G06F 3/046
2022/0066583 A1* 3/2022 Kishimoto ............ G06F 3/0446
2023/0028970 A1* 1/2023 Tanaka .................... G06F 3/041
2026/0007040 A1* 1/2026 Nam .................... H10K 59/871

FOREIGN PATENT DOCUMENTS

KR 20190096268 A 8/2019
KR 10-2401014 5/2022

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0105508 under 35 U.S.C. § 119, filed on Aug. 23, 2022, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

As the information society develops, the demand for a display device for displaying an image is increasing in various forms. For example, the display device has been applied to various electronic devices such as smartphones, digital cameras, laptop computers, navigation devices, and smart televisions. The display devices may be flat panel display devices such as liquid crystal display devices, field emission display devices, or organic light emitting display devices.

Recently, a foldable display device has received a lot of attention. The foldable display device has both advantages of a smartphone and a tablet PC because it is portable and may have a wide screen.

SUMMARY

Aspects of the disclosure provide a display device having improved reliability by preventing residues of an adhesive member from remaining on a laser cut surface during a laser cutting process using a laser, and a method of manufacturing the same.

However, aspects of the disclosure are not restricted to those set forth herein. The above and other aspects of the disclosure will become more apparent to one of ordinary skill in the art to which the disclosure pertains by referencing the detailed description of the disclosure given below.

The display device according to an embodiment may include an adhesive member disposed between a polarizing member and a window member and including an ultraviolet light absorber. As the adhesive member includes the ultraviolet light absorber, transmittance of an ultraviolet laser irradiated to the adhesive member is lowered during the cutting process using the ultraviolet laser, and the adhesive member may be readily cut.

According to an embodiment of the disclosure, a display device may include a display panel including a first surface and a second surface opposite to the first surface, a polarizing member disposed on the first surface of the display panel, a window member disposed on the polarizing member, and a first adhesive member disposed between the window member and the polarizing member and including an ultraviolet light absorber. A side surface of the display panel, a side surface of the polarizing member, and a side surface of the first adhesive member may have a first surface roughness, an upper surface of the first adhesive member may have a second surface roughness less than the first surface roughness, and the side surface of the display panel, the side surface of the polarizing member, and the side surface of the first adhesive member may be aligned at a boundary.

A light transmittance of the first adhesive member may be less than or equal to about 6% in a wavelength band in a range of about 300 nm to about 380 nm.

The light transmittance of the first adhesive member may be in a range of about 6% to about 30% at a wavelength of about 380 nm.

The light transmittance of the first adhesive member may be greater than or equal to about 80% in a wavelength band in a range of about 400 to about 800 nm.

The ultraviolet light absorber may include benzotriazole, benzophenone, salicylic acid, salicylate, cyanoacrylate, cinnamate, oxanilide, polystyrene, polyferrocenylsilane, methine, azomethine, triazine, para-aminobenzoic acid, cinnamic acid, an urocanic acid-based light-absorbing dye, or a combination thereof.

An elastic modulus of the first adhesive member at −20° C. may be in a range of about 0.05 MPa to about 0.15 MPa.

A thickness of the first adhesive member in a thickness direction of the display panel may be in a range of about 25 μm to about 75 μm.

The display device may further include a second adhesive member disposed between the polarizing member and the display panel. A side surface of the second adhesive member may have the first surface roughness and may be aligned with the side surface of the display panel, the side surface of the polarizing member, and the side surface of the first adhesive member at the boundary.

A light transmittance of the second adhesive member may be higher than the light transmittance of the first adhesive member.

The display device may further include a protective member disposed on the window member, and a third adhesive member disposed between the protective member and the window member. A side surface of the third adhesive member may have a third surface roughness less than the first surface roughness.

The side surface of the third adhesive member may be aligned at a boundary different from the boundary the side surface of the first adhesive member, and the side surface of the second adhesive member are aligned.

According to an embodiment of the disclosure, a display device may include a display panel including a first surface and a second surface opposite to the first surface, a polarizing member disposed on the first surface of the display panel, a window member disposed on the polarizing member, a protective member disposed on the window member, a first adhesive member disposed between the window member and the polarizing member, and a second adhesive member disposed between the window member and the protective member. A side surface of the first adhesive member may have a first surface roughness, and a side surface of the second adhesive member may have a second surface roughness less than the first surface roughness.

A side surface of the display panel, a side surface of the polarizing member, and the side surface of the first adhesive member may have the first surface roughness, and the side surface of the display panel, the side surface of the polarizing member, and the side surface of the first adhesive member may be aligned at a same boundary.

The side surface of the first adhesive member and the side surface of the second adhesive member may be aligned at different boundaries.

The first adhesive member may include an ultraviolet light absorber, and a light transmittance of the first adhesive member may be less than or equal to about 6% in a wavelength band in a range of about 300 nm to about 380 nm.

The light transmittance of the first adhesive member may be in a range of about 6% to about 30% at a wavelength of about 380 nm.

According to an embodiment of the disclosure, a method of manufacturing a display device may include providing a display panel including a first surface and a second surface opposite to the first surface, sequentially forming a first adhesive member, a polarizing member, a second adhesive member including an ultraviolet light absorber, and a release film on the first surface of the display panel, and simultaneously cutting the display panel, the first adhesive member, the polarizing member, the second adhesive member, and the release film by irradiating laser light to the second surface of the display panel.

In the simultaneously cutting of the display panel, the first adhesive member, the polarizing member, the second adhesive member, and the release film, a side surface of the display panel, a side surface of the polarizing member, a side surface of the first adhesive member, and a side surface of the release film may have a same surface roughness.

In the simultaneously cutting of the display panel, the first adhesive member, the polarizing member, the second adhesive member, and the release film, a light transmittance of the second adhesive member may be less than or equal to about 6% in a wavelength band in a range of about 300 nm to about 380 nm and in a range of about 6% to about 30% at a wavelength of about 380 nm In the simultaneously cutting of the display panel, the first adhesive member, the polarizing member, the second adhesive member, and the release film, the light transmittance of the second adhesive member may be greater than or equal to about 80% in a wavelength band in a range of about 400 nm to about 800 nm.

Accordingly, by preventing the residues of the adhesive member from remaining on the cut surface of the adhesive member, subsequent processes may be smoothly performed, and the display device having improved reliability may be provided to a user.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
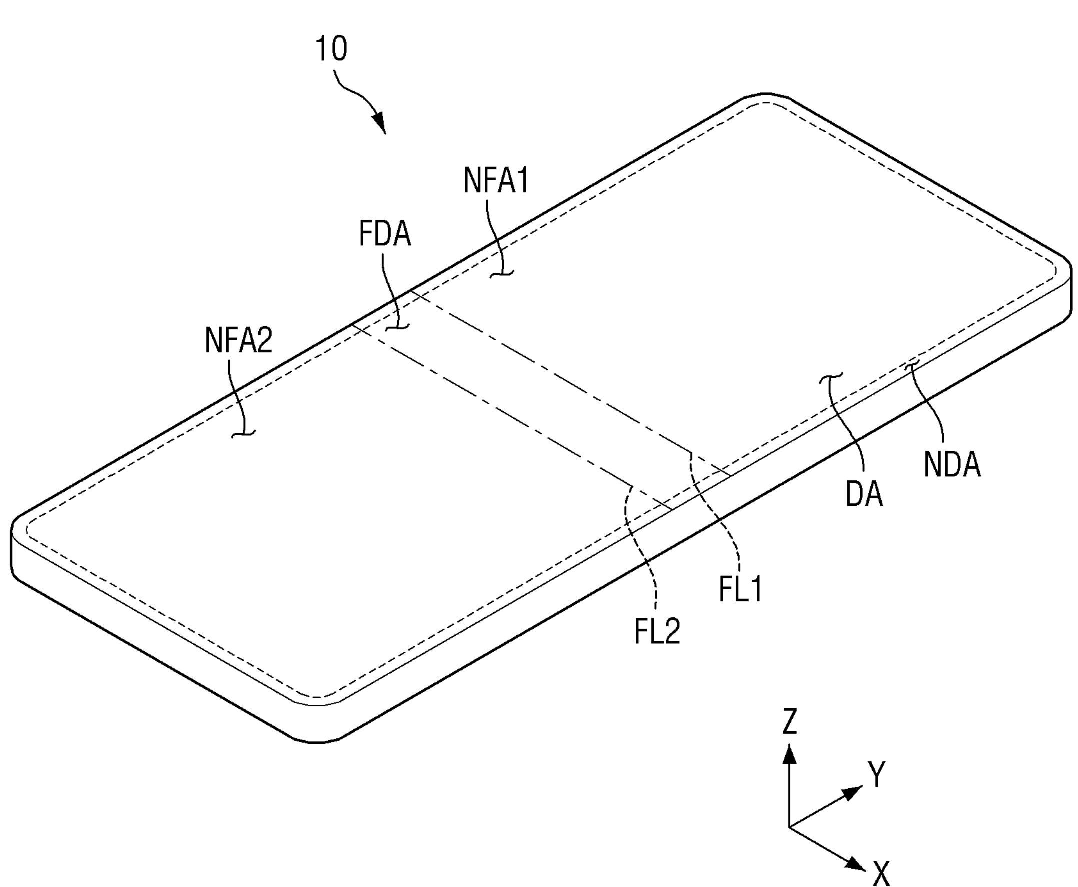
FIG. 1 is a perspective view illustrating a state in which a display device is unfolded according to an embodiment.

The embodiments will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2:
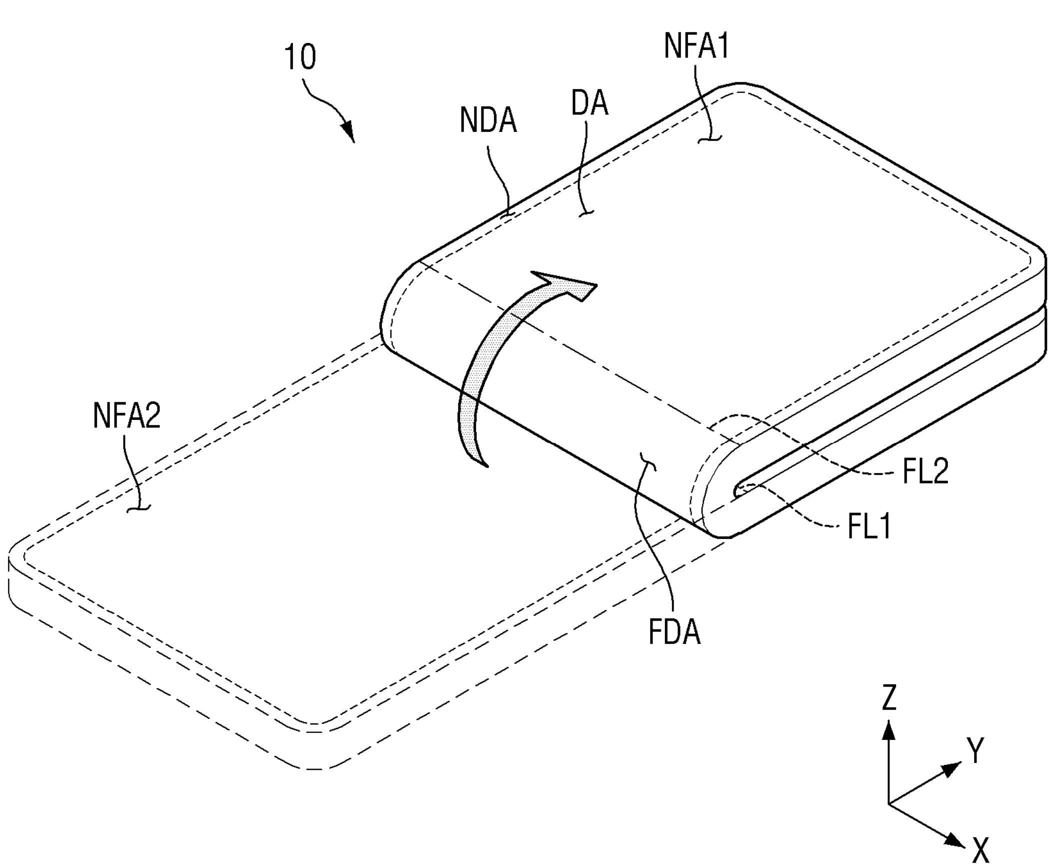
FIG. 2 is a perspective view illustrating a state in which a display device is folded according to an embodiment.

FIGS. 1 and 2 are perspective views illustrating a display device according to an embodiment. FIG. 1 is a perspective view illustrating a state in which a display device is unfolded according to an embodiment. FIG. 2 is a perspective view illustrating a state in which a display device is folded according to an embodiment.

In FIGS. 1 and 2, a first direction (X-axis direction) may be a direction parallel to a side of a display device 10 in a plan view, for example, a horizontal direction of the display device 10. A second direction (Y-axis direction) may be a direction parallel to another side extending from the side of the display device 10 in a plan view, for example, a vertical direction of the display device 10. A third direction (Z-axis direction) may be a thickness direction of the display device 10.

The display device 10 may have a rectangular or square shape in a plan view. The display device 10 may have a rectangular shape in which corners thereof are perpendicular or a rectangular shape in which corners thereof are rounded in a plan view. The display device 10 may include two short sides extending in the first direction (X-axis direction) and two long sides extending in the second direction (Y-axis direction) when viewed on a plan view.

The display device 10 may include a display area DA and a non-display area NDA. A shape of the display area DA may correspond to a shape of the display device 10 in a plan view. For example, in case that the display device 10 has a rectangular shape in a plan view, the display area DA may also have a rectangular shape.

The display area DA may be an area including multiple pixels to display an image. The pixels may be arranged in a matrix direction. The pixels may have a rectangular shape, a rhombus shape, or a square shape in a plan view, but are not limited thereto. For example, the pixels may have other quadrangular shapes other than the rectangular shape, the rhombus shape, or the square shape, and other polygonal shapes, circular shapes, or elliptical shapes other than the quadrangular shape in a plan view.

The non-display area NDA may be an area that does not include the pixels and does not display the image. The non-display area NDA may be disposed adjacent to the display area DA. The non-display area NDA may be disposed to surround the display area DA as illustrated in FIGS. 1 and 2, but is not limited thereto. The display area DA may be partially surrounded by the non-display area NDA.

The display device 10 may maintain both a folded state and an unfolded state. The display device 10 may be folded in an in-folding manner in which the display area DA is disposed on an inner side as illustrated in FIG. 2. In case that the display device 10 is folded in the in-folding manner, front surfaces of the display device 10 may face each other. In another embodiment, the display device 10 may be folded in an out-folding manner in which the display area DA is disposed on an outer side. In case that the display device 10 is folded in the out-folding manner, rear surfaces of the display device 10 may face each other.

The display device 10 may include a folding area FDA, a first non-folding area NFA1, and a second non-folding area NFA2. The folding area FDA may be an area in which the display device 10 is bent or folded, and the first non-folding area NFA1 and the second non-folding area NFA2 may be areas in which the display device 10 is not bent or folded.

The first non-folding area NFA1 may be disposed on a side, for example, an upper side of the folding area FDA. The second non-folding area NFA2 may be disposed on another side, for example, a lower side of the folding area FDA. The folding area FDA may be an area defined by the first folding line FL1 and the second folding line FL2 and may be a bent area with a curvature. A first folding line FL1 may be a boundary between the folding area FDA and the first non-folding area NFA1, and a second folding line FL2 may be a boundary between the folding area FDA and the second non-folding area NFA2.

As illustrated in FIGS. 1 and 2, the first folding line FL1 and the second folding line FL2 may extend in the first direction (X-axis direction), and the display device 10 may be folded in the second direction (Y-axis direction). Accordingly, since a length of the display device 10 in the second direction (Y-axis direction) may be reduced by about half, it may be convenient for a user to carry the display device 10.

In case that the first folding line FL1 and the second folding line FL2 extend in the first direction (X-axis direction) as illustrated in FIGS. 1 and 2, a length of the folding area FDA in the second direction (Y-axis direction) may be shorter than a length thereof in the first direction (X-axis direction). A length of the first non-folding area NFA1 in the second direction (Y-axis direction) may be longer than a length of the first non-folding area NFA1 in the first direction (X-axis direction). A length of the second non-folding area NFA2 in the second direction (Y-axis direction) may be longer than a length of the second non-folding area NFA2 in the first direction (X-axis direction).

Each of the display area DA and the non-display area NDA may overlap at least one of the folding area FDA, the first non-folding area NFA1, and the second non-folding area NFA2 in a thickness direction of the display device 10. It is illustrated in FIGS. 1 and 2 that each of the display area DA and the non-display area NDA overlaps the folding area FDA, the first non-folding area NFA1, and the second non-folding area NFA2.

Figure 3:
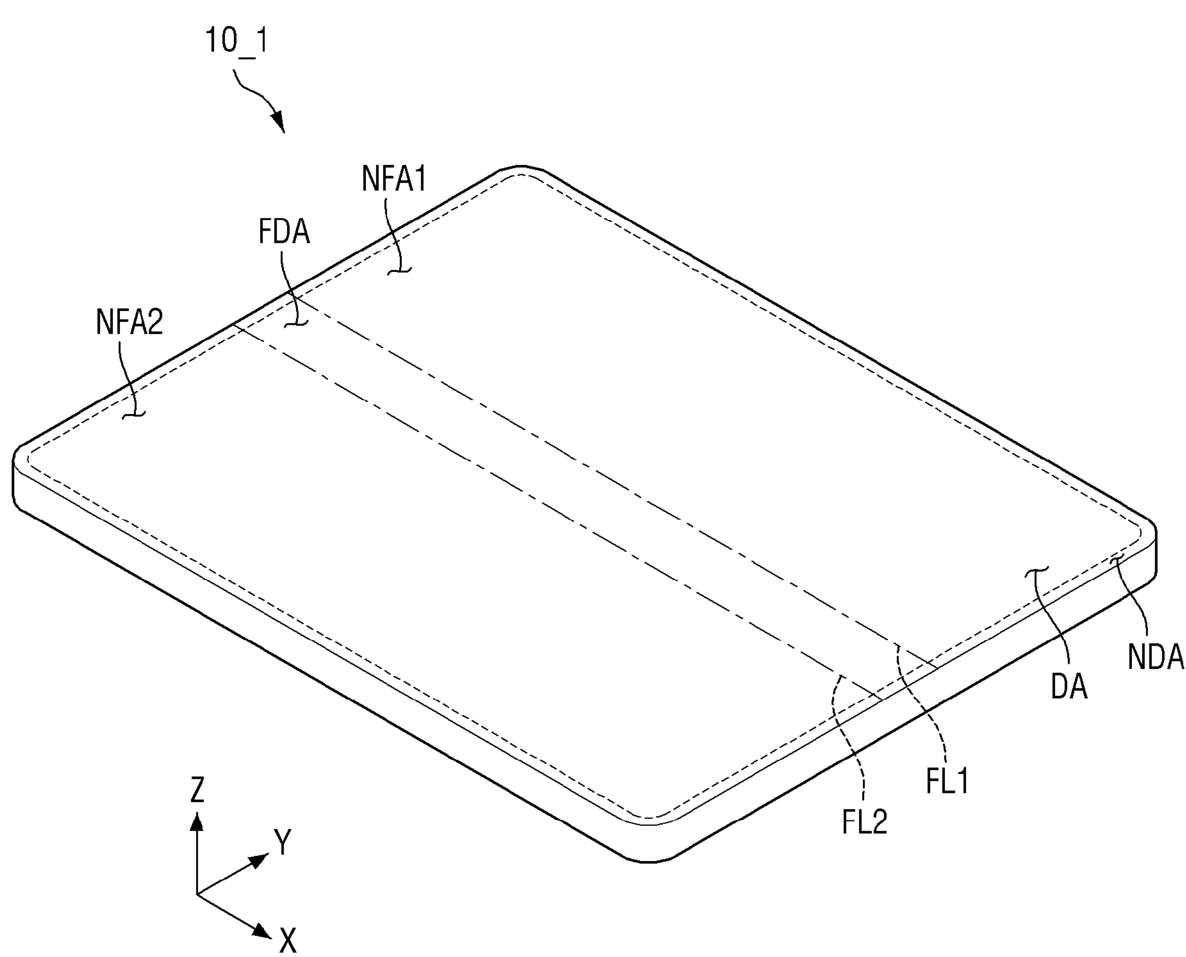
FIG. 3 is a perspective view illustrating a state in which a display device is unfolded according to another embodiment.
Figure 4:
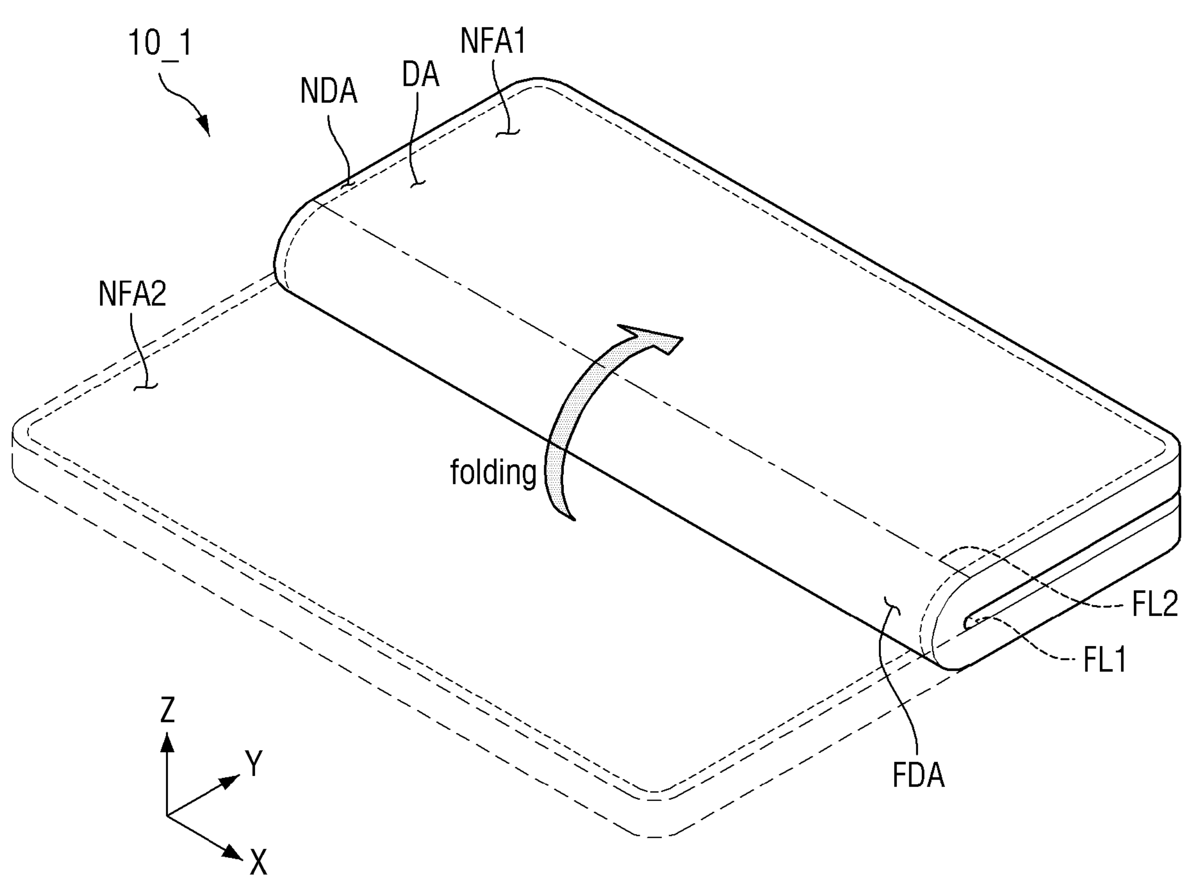
FIG. 4 is a perspective view illustrating a state in which a display device is folded according to another embodiment.

FIGS. 3 and 4 are perspective views illustrating a display device according to another embodiment. FIG. 3 is a perspective view illustrating a state in which a display device is unfolded according to another embodiment. FIG. 4 is a perspective view illustrating a state in which a display device is folded according to another embodiment.

The embodiments of FIGS. 3 and 4 are different from the embodiments of FIGS. 1 and 2 in that since the first folding line FL1 and the second folding line FL2 extend in the first direction (X-axis direction) and a display device 10_1 is folded in the second direction (Y-axis direction), a length of the display device 10_1 in the second direction (Y-axis direction) may be reduced by about half, and as a result, it may be convenient for the user to carry the display device 10_1. Redundant descriptions of the embodiments of FIGS. 3 and 4 will be omitted.

Figure 5:
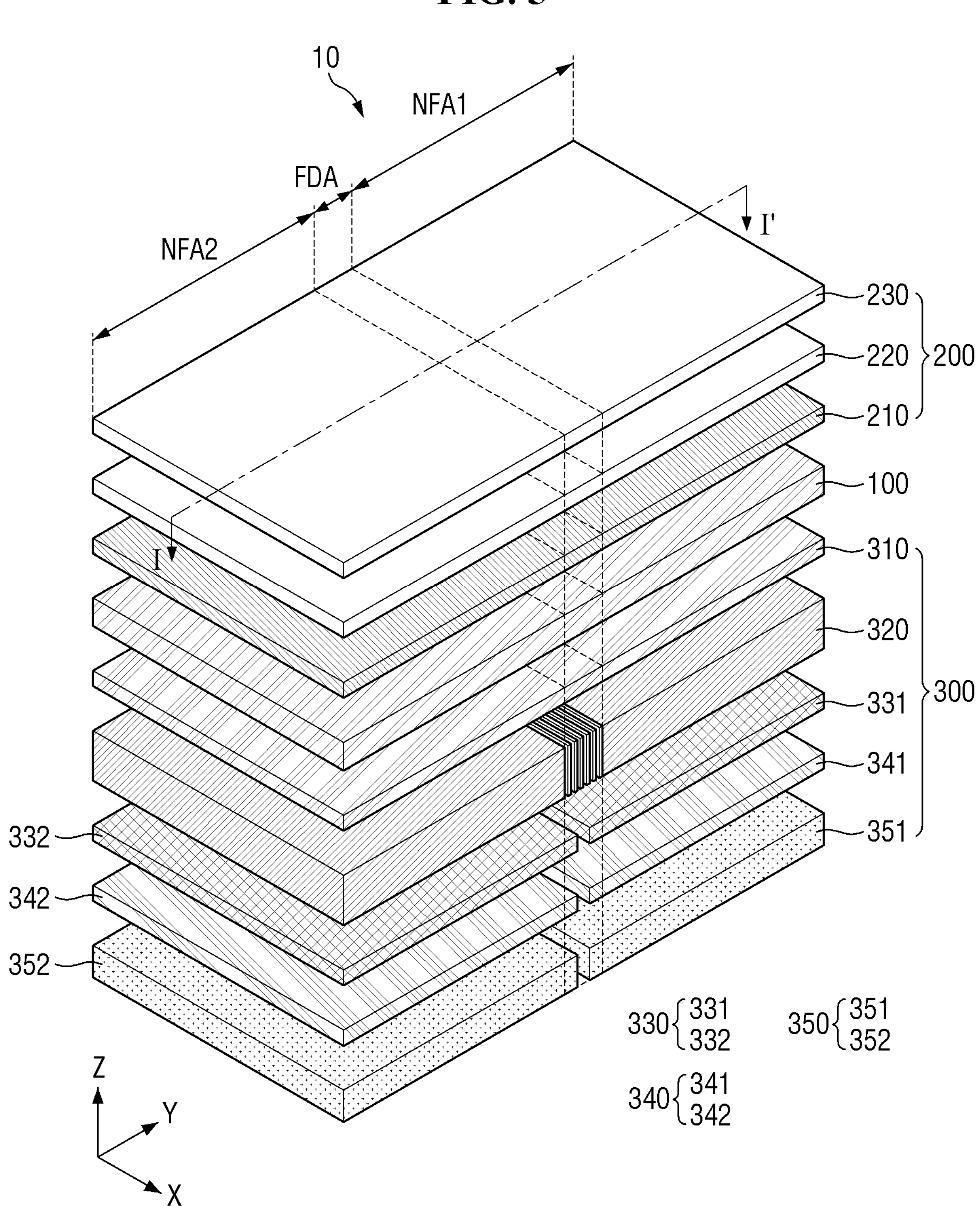
FIG. 5 is an exploded perspective view of the display device of FIG. 1 according to an embodiment.
Figure 6:
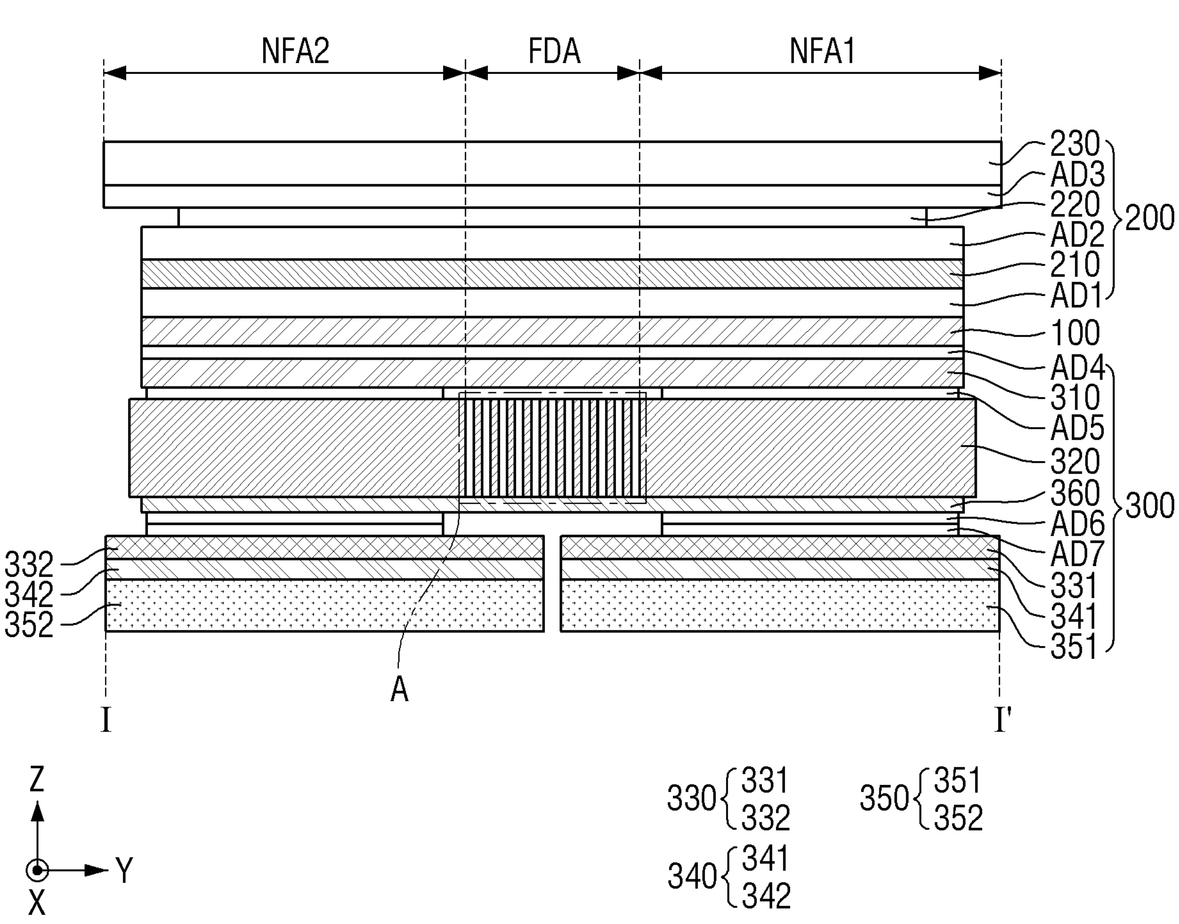
FIG. 6 is a schematic cross-sectional view of a display device taken along line I-I' of FIG. 5 according to an embodiment.
Figure 7:
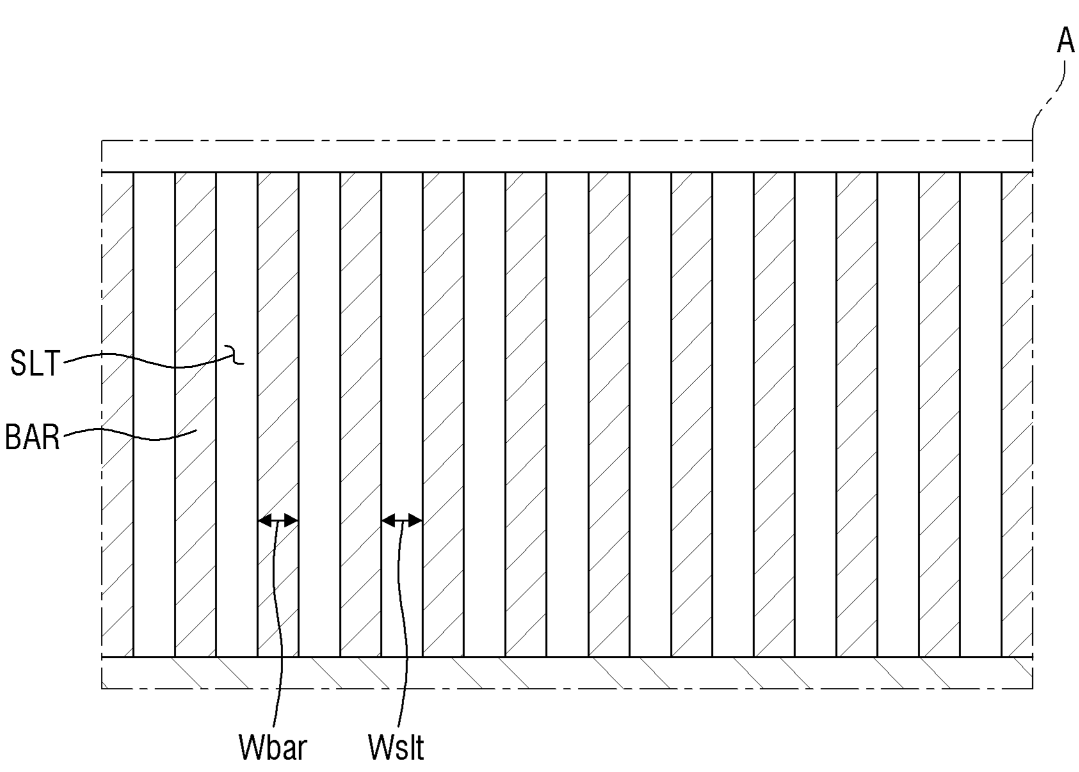
FIG. 7 is an enlarged view of area A of FIG. 6 according to an embodiment.

FIG. 5 is an exploded perspective view of the display device of FIG. 1 according to the embodiment. FIG. 6 is a schematic cross-sectional view of a display device taken along line I-I' of FIG. 5 according to an embodiment. FIG. 7 is an enlarged view of area A of FIG. 6 according to an embodiment.

Referring to FIGS. 5 and 6, the display device 10 may include a display panel 100, a front stacked structure 200 stacked on the front surface (or upper surface) of the display panel 100, and a rear stacked structure 300 stacked on the rear surface (or lower surface) of the display panel 100. The front surface of the display panel 100 may refer to a direction in which the display panel 100 displays a screen, and the rear surface thereof may refer to a direction opposite to the front. A surface of the display panel 100 may be positioned on the front, and another surface of the display panel 100 may be positioned on the rear.

The front stacked structure 200 may include a polarizing film 210, a window 220, and a protective film 230, and the rear stacked structure 300 may include a panel lower member 310, a light blocking member 320, a digitizer layer 330, a shielding member 340, a heat dissipation member 350, and a buffer member 360.

The front stacked structure 200 may include a first adhesive member AD1 disposed between the display panel 100 and the polarizing film 210, a second adhesive member AD2 disposed between the polarizing film 210 and the window 220, and a third adhesive member AD3 disposed between the window 220 and the protective film 230. The rear stacked structure 300 may include a fourth adhesive member AD4 disposed between the display panel 100 and the panel lower member 310, a fifth adhesive member AD5 disposed between the panel lower member 310 and the light blocking member 320, and a sixth adhesive member AD6 and a seventh adhesive member AD7 disposed between the buffer member 360 and the digitizer layer 330.

Examples of the display panel 100 for displaying an image may include an organic light emitting display panel using an organic light emitting diode (LED), a quantum dot light emitting display panel including a quantum dot light emitting layer, an inorganic light emitting display panel including an inorganic semiconductor, and a micro light emitting display panel using a micro light emitting diode. Hereinafter, the display panel 100 is described as an organic light emitting display panel, but the disclosure is not limited thereto. A detailed description of the display panel 100 will be described below with reference to FIG. 8.

The polarizing film 210 may be disposed on a front surface of the display panel 100. The polarizing film 210 may be attached to the front surface of the display panel 100 by the first adhesive member AD1. The first adhesive member AD1 may be a transparent pressure sensitive adhesive (PSA), an optically clear adhesive (OCA) film, or an optically clear resin (OCR).

The polarizing film 210 may include a linear polarizing plate and a retardation film such as a λ/4 plate (quarter-wave plate).

The window 220 may be disposed on a front surface of the polarizing film 210. The window 220 may be attached to the front surface of the polarizing film 210 by the second adhesive member AD2. The second adhesive member AD2 may be a transparent pressure sensitive adhesive (PSA), an optically clear adhesive (OCA) film, or an optically clear resin (OCR), which may be the same as the first adhesive member AD1.

The window 220 may be made of a transparent material and may include, for example, glass or plastic. For example, the window 220 may be an ultra-thin glass (UTG) having a thickness equal to or less than about 0.1 mm or a transparent polyimide film, but is not limited thereto.

The protective film 230 may be disposed on a front surface of the window 220. The protective film 230 may be attached to the front surface of the window 220 by the third adhesive member AD3. The third adhesive member AD3 may be a transparent pressure sensitive adhesive (PSA), an optically clear adhesive (OCA) film, or an optically clear resin (OCR), which may be the same as the second adhesive member AD2. A detailed description of the first adhesive member AD1, the second adhesive member AD2, and the third adhesive member AD3 will be described below with reference to FIGS. 9 and 10.

The protective film 230 may perform at least one function of chattering prevention, shock absorption, dent prevention, fingerprint prevention, and glare prevention of the window 220.

The panel lower member 310 may be disposed on a rear surface of the display panel 100. The panel lower member 310 may be attached to the rear surface of the display panel 100 by the fourth adhesive member AD4. The fourth adhesive member AD4 may be a pressure sensitive adhesive (PSA).

The panel lower member 310 may be a buffer layer for absorbing a shock from the outside. The panel lower member 310 may prevent the display panel 100 from being damaged by absorbing the shock from the outside. The panel lower member 310 may be formed of a single layer or multiple layers. For example, the panel lower member 310 may include a material having elasticity, such as rubber, a urethane-based material, or a sponge formed by foaming an acrylic-based material.

Although it is illustrated in FIGS. 5 and 6 that the panel lower member 310 is disposed in the folding area FDA, the disclosure is not limited thereto. For example, the panel lower member 310 may be removed from the folding area FDA to allow the display device 10 to be smoothly folded.

The light blocking member 320 may be disposed on a rear surface of the panel lower member 310. The light blocking member 320 may be attached to the rear surface of the panel lower member 310 by the fifth adhesive members AD5. The fifth adhesive members AD5 may not be disposed in the folding area FDA to reduce folding stress of the display device 10. For example, one fifth adhesive member AD5 may be disposed in the first non-folding area NFA1, and another fifth adhesive member AD5 may be disposed in the second non-folding area NFA2. The fifth adhesive members AD5 may be pressure sensitive adhesives.

The light blocking member 320 may be made of a polymer including carbon fibers or glass fibers. In case that the light blocking member 320 includes carbon fibers, the polymer may be epoxy, polyester, polyamide, polycarbonate, polypropylene, polybutylene, or vinyl ester. In case that the light blocking member 320 includes glass fibers, the polymer may be epoxy, polyester, polyamide, or vinyl ester.

In case that the light blocking member 320 includes carbon fibers, the Young's modulus of the light blocking member 320 may be in a range of approximately 20 GPa to approximately 30 GPa. In case that the light blocking member 320 includes glass fibers, the Young's modulus of the light blocking member 320 may be in a range of approximately 70 GPa to approximately 130 GPa.

A width of the carbon fiber yarn or the glass fiber yarn of the light blocking member 320 may be in a range of approximately 7 μm to approximately 10 μm, but is not limited to the numerical range described above. A thickness of the light blocking member 320 may be in a range of approximately 100 μm to approximately 300 μm in a thickness direction of display device 10, but is not limited to the numerical range described above. The thickness of the light blocking member 320 may be greater than a thickness of the digitizer layer 330 or a thickness of the shielding member 340. The thickness of the light blocking member 320 may be greater than a thickness of the display panel 100.

Referring to FIG. 7, the light blocking member 320 may include multiple bars BAR disposed in the folding area FDA to be readily bent in the folding area FDA. An extension direction of each of the bars BAR may be substantially the same as an extension direction of the first folding line FL1 and an extension direction of the second folding line FL2. For example, each of the bars BAR may extend in the first direction (X-axis direction). The bars BAR may be arranged in the second direction (Y-axis direction). A slit SLT may be disposed between adjacent bars BAR among the bars BAR. In case that a width Wbar of each of the bars BAR is greater than a width Wslt of each of the slits SLT in the second direction (Y-axis direction), the light blocking member 320 may not be readily bent. Therefore, the width Wbar of each of the bars BAR may be less than the width Wslt of each of the slits SLT as illustrated in FIG. 7.

The buffer member 360 may be disposed on a rear surface of the light blocking member 320. The buffer member 360 may be attached to the rear surface of the light blocking member 320 by the sixth adhesive members AD6.

The buffer member 360 may absorb an external shock to prevent the light blocking member 320 and the digitizer layer 330 from being damaged. The buffer member 360 may include a material having elasticity, such as rubber, a urethane-based material, or a sponge formed by foaming an acrylic-based material.

The digitizer layer 330 may include a first digitizer layer 331 and a second digitizer layer 332. The first digitizer layer 331 and the second digitizer layer 332 may be disposed on a rear surface of the buffer member 360. The first digitizer layer 331 and the second digitizer layer 332 may be attached to the rear surface of the buffer member 360 by the sixth adhesive member and the seventh adhesive members AD7. The sixth adhesive members AD6 may not be disposed in the folding area FDA to reduce folding stress of the display device 10. For example, one sixth adhesive member AD6 may be disposed in the first non-folding area NFA1, and another sixth adhesive member AD6 may be disposed in the second non-folding area NFA2. The sixth adhesive members AD6 may be pressure sensitive adhesives. The seventh adhesive members AD7 may be pressure sensitive adhesives.

According to an embodiment, the first digitizer layer 331, the second digitizer layer 332, sixth adhesive members AD6, and the seventh adhesive members AD7 may not be disposed in the folding area FDA to reduce folding stress of the display device 10. In another embodiment, as shown in FIG. 6, a portion of each of the first digitizer layer 331 and the second digitizer layer 332 may be removed in the folding area FDA to reduce folding stress of the display device 10. For example, the first digitizer layer 331 and one of the sixth and seventh adhesive members AD6 and AD7 may be disposed in the first non-folding area NFA1, and the second digitizer layer 332 and another one of the sixth and seventh adhesive members AD6 and AD7 may be disposed in the second non-folding area NFA2. A gap between the first digitizer layer 331 and the second digitizer layer 332 in the second direction (Y-axis direction) may overlap the folding area FDA in a plan view and may be less than a width of the folding area FDA. The width of the folding area FDA may be the length of the folding area FDA in the second direction (Y-axis direction).

The first digitizer layer 331 and the second digitizer layer 332 may include electrode patterns for sensing approach or contact of an electronic pen such as a stylus pen supporting electromagnetic resonance (EMR). The first digitizer layer 331 and the second digitizer layer 332 may sense a magnetic field or electromagnetic signal emitted from the electronic pen by the electrode patterns, and may determine a point where the sensed magnetic field or electromagnetic signal is greatest as touch coordinates.

The shielding member 340 may include a first shielding member 341 and a second shielding member 342. The first shielding member 341 and the second shielding member 342 may be disposed on a rear surface of the digitizer layer 330.

A portion of each of the first shielding member 341 and the second shielding member 342 may be removed in the folding area FDA to reduce folding stress of the display device 10. For example, the first shielding member 341 may be disposed in the first non-folding area NFA1, and the second shielding member 342 may be disposed in the second non-folding area NFA2. A gap between the first shielding member 341 and the second shielding member 342 in the second direction (Y-axis direction) may overlap the folding area FDA in a plan view and may be less than the width of the folding area FDA.

The first shielding member 341 and the second shielding member 342 may include magnetic metal powder allowing the magnetic field or electromagnetic signal passing through the digitizer layer 330 to flow into the first shielding member 341 and the second shielding member 342. Therefore, the first shielding member 341 and the second shielding member 342 may block the magnetic field or electromagnetic signal from flowing into the rear surfaces of the first shielding member 341 and the second shielding member 342.

The heat dissipation member 350 may include a first heat dissipation member 351 and a second heat dissipation member 352. The first heat dissipation member 351 and the second heat dissipation member 352 may be disposed on a rear surface of the shielding member 340.

A portion of the first heat dissipation member 351 and the second heat dissipation member 352 may be removed in the folding area FDA to reduce folding stress of the display device 10. For example, the first heat dissipation member 351 may be disposed in the first non-folding area NFA1, and the second heat dissipation member 352 may be disposed in the second non-folding area NFA2. A gap between the first heat dissipation member 351 and the second heat dissipation member 352 in the second direction (Y-axis direction) may overlap the folding area FDA in a plan view and may be less than the width of the folding area FDA.

The first heat dissipation member 351 and the second heat dissipation member 352 may be formed of a metal film including copper, nickel, ferrite, or silver having excellent thermal conductivity. Accordingly, heat generated in the display device 10 may be discharged to the outside by the first heat dissipation member 351 and the second heat dissipation member 352.

As illustrated in FIG. 6, as the light blocking member 320 is disposed on the digitizer layer 330 and the shielding member 340, it is possible to prevent a step difference between the electrode patterns of the digitizer layer 330 or the magnetic metal powder of the shielding member 340 from being visually recognized by the user on the front surface of the display device 10.

Figure 8:
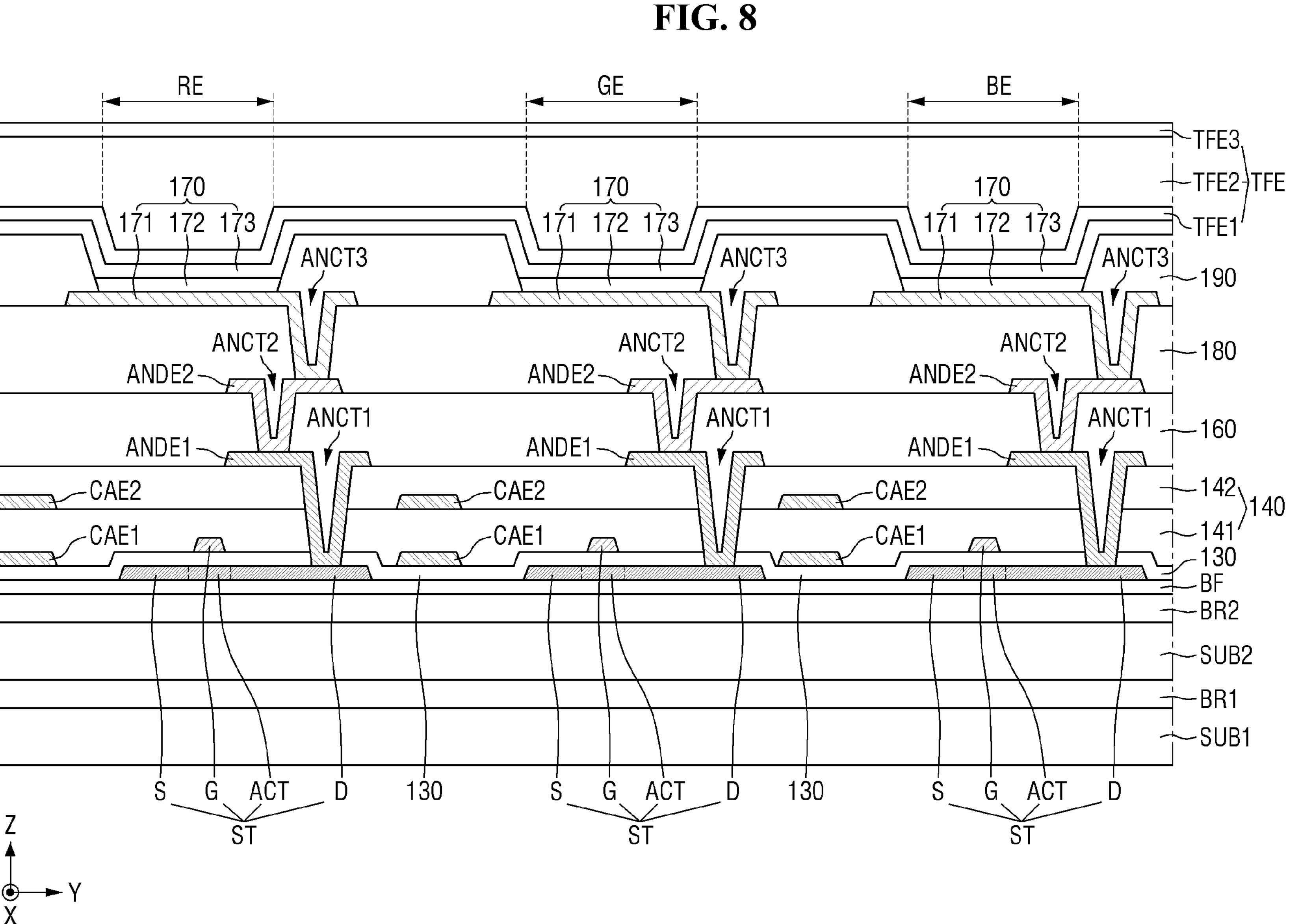
FIG. 8 is a schematic cross-sectional view of a display panel of FIG. 6 according to an embodiment.

FIG. 8 is a schematic cross-sectional view of a display panel of FIG. 6 according to an embodiment.

Referring to FIG. 8, a first barrier film BR1 may be disposed on a first substrate SUB1, a second substrate SUB2 may be disposed on the first barrier film BR1, and a second barrier film BR2 may be disposed on the second substrate SUB2.

Each of the first substrate SUB1 and the second substrate SUB2 may be formed of an insulating material such as a polymer resin. For example, the first substrate SUB1 and the second substrate SUB2 may include polyimide. Each of the first substrate SUB1 and the second substrate SUB2 may be a flexible substrate that may be bent, folded, rolled, or the like.

Each of the first barrier film BR1 and the second barrier film BR2 may be a film for protecting thin film transistors of a thin film transistor layer and a light emitting layer 172 of a light emitting element 170 from moisture permeating through the first and second substrates SUB1 and SUB2, which are vulnerable to moisture permeation. Each of the first barrier film BR1 and the second barrier film BR2 may be formed of multiple inorganic films alternately stacked each other. For example, each of the first barrier film BR1 and the second barrier film BR2 may be formed as a multilayer film in which one or more inorganic films of a silicon nitride layer, a silicon oxynitride layer, a silicon oxide layer, a titanium oxide layer, and an aluminum oxide layer are alternately stacked each other.

A buffer film BF may be disposed on the second barrier film BR2. The buffer film BF may be formed of at least one inorganic film. For example, the buffer film BF may include one or more inorganic films of a silicon nitride layer, a silicon oxynitride layer, a silicon oxide layer, a titanium oxide layer, and an aluminum oxide layer.

A thin film transistor ST may be disposed on the barrier film BR. The thin film transistor ST may include an active layer ACT, a gate electrode G, a source electrode S, and a drain electrode D.

The active layer ACT, the source electrode S, and the drain electrode D may be disposed on the buffer film BF. The active layer ACT may include polycrystalline silicon, single crystal silicon, low-temperature polycrystalline silicon, amorphous silicon, or an oxide semiconductor. The source electrode and the drain electrode may have conductivity by doping a silicon semiconductor or an oxide semiconductor with ions or impurities. The active layer ACT may overlap the gate electrode G in the third direction (Z-axis direction), and the source electrode S and the drain electrode D may not overlap the gate electrode G in the third direction (Z-axis direction).

A gate insulating film 130 may be disposed on the active layer ACT, the source electrode S, and the drain electrode D of the thin film transistor ST. The gate insulating film 130 may be formed of an inorganic layer, for example, a silicon nitride layer, a silicon oxynitride layer, a silicon oxide layer, a titanium oxide layer, or an aluminum oxide layer.

A gate electrode G and a first capacitor electrode CAE1 may be disposed on the gate insulating film 130. The gate electrode G may overlap the active layer ACT in the third direction (Z-axis direction). The first capacitor electrode CAE1 may overlap a second capacitor electrode CAE2 in the third direction (Z-axis direction). Each of the gate electrode G and the first capacitor electrode CAE1 may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof.

A first interlayer insulating film 141 may be disposed on the gate electrode G and the first capacitor electrode CAE1. The first interlayer insulating film 141 may be formed of an inorganic layer, for example, a silicon nitride layer, a silicon oxynitride layer, a silicon oxide layer, a titanium oxide layer, or an aluminum oxide layer. The first interlayer insulating film 141 may include multiple inorganic films.

The second capacitor electrode CAE2 may be disposed on the first interlayer insulating film 141. The second capacitor electrode CAE2 may overlap the first capacitor electrode CAE1 in the third direction (Z-axis direction). Since the first interlayer insulating film 141 has a dielectric constant, a capacitor may be formed by the first capacitor electrode CAE1, the second capacitor electrode CAE2, and the first interlayer insulating film 141 disposed between the first capacitor electrode CAE1 and the second capacitor electrode CAE2. The second capacitor electrode CAE2 may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof.

A second interlayer insulating film 142 may be disposed on the second capacitor electrode CAE2. The second interlayer insulating film 142 may be formed of an inorganic layer, for example, a silicon nitride layer, a silicon oxynitride layer, a silicon oxide layer, a titanium oxide layer, or an aluminum oxide layer. The second interlayer insulating film 142 may include multiple inorganic films.

A first anode connection electrode ANDE1 may be disposed on the second interlayer insulating film 142. The first anode connection electrode ANDE1 may be connected to the drain electrode D through a first anode contact hole ANCT1 that penetrates through the interlayer insulating films 140 including the first interlayer insulating film 141 and the second interlayer insulating film 142 to expose the drain electrode D. The first anode connection electrode ANDE1 may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof.

A first organic film 160 for planarization may be disposed on the first anode connection electrode ANDE1. The first organic film 160 may be formed as an organic film made of an acryl resin, an epoxy resin, a phenolic resin, a polyamide resin, a polyimide resin, or the like.

A second anode connection electrode ANDE2 may be disposed on the first organic film 160. The second anode connection electrode ANDE2 may be connected to the first anode connection electrode ANDE1 through a second anode contact hole ANCT2 that penetrates through the first organic film 160 to expose the first anode connection electrode ANDE1. The second anode connection electrode ANDE2 may be formed as a single layer or multiple layers made of at least one of molybdenum (Mo), aluminum (Al), chromium (Cr), gold (Au), titanium (Ti), nickel (Ni), neodymium (Nd), and copper (Cu), or alloys thereof.

A second organic film 180 may be disposed on the second anode connection electrode ANDE2. The second organic film 180 may be formed as an organic film made of an acryl resin, an epoxy resin, a phenolic resin, a polyamide resin, a polyimide resin, or the like.

It is illustrated in FIG. 8 that the thin film transistor ST is formed in a top gate manner in which the gate electrode G is positioned on an upper side of the active layer ACT, but the disclosure is not limited thereto. The thin film transistor ST may be formed in a bottom gate manner in which the gate electrode G is positioned on a lower side of the active layer ACT or a double gate manner in which the gate electrode G is positioned on both the upper and lower sides of the active layer ACT.

Light emitting elements 170 and a bank 190 may be disposed on the second organic film 180. Each of the light emitting elements 170 may include a first light emitting electrode 171, a light emitting layer 172, and a second light emitting electrode 173.

The first light emitting electrode 171 may be formed on the second organic film 180. The first light emitting electrode 171 may be connected to the second anode connection electrode ANDE2 through a third anode contact hole ANCT3 that penetrates through the second organic film 180 to expose the second anode connection electrode ANDE2.

In a top emission structure in which light is emitted toward the second light emitting electrode 173 from the light emitting layer 172, the first light emitting electrode 171 may be formed of a metal having high reflectance, such as a stacked structure of aluminum and titanium (Ti/Al/Ti), a stacked structure of aluminum and indium tin oxide (ITO) (ITO/Al/ITO), an APC alloy, and a stacked structure of an APC alloy and ITO (ITO/APC/ITO). The APC alloy may be an alloy of silver (Ag), palladium (Pd), and copper (Cu).

The bank 190 may be formed to partition the first light emitting electrode 171 on the second organic film 180 to define light emitting areas RE, GE, and BE. The bank 190 may be formed to cover an edge of the first light emitting electrode 171. The bank 190 may be formed of an organic material such as an acrylic resin, an epoxy resin, a phenolic resin, a polyamide resin, or a polyimide resin.

Each of the light emitting areas RE, GE, and BE may be an area in which the first light emitting electrode 171, the light emitting layer 172, and the second light emitting electrode 173 are sequentially stacked and holes from the first light emitting electrode 171 and electrons from the second light emitting electrode 173 are combined with each other in the light emitting layer 172 to emit light.

The light emitting layer 172 may be formed on the first light emitting electrode 171 and the bank 190. The light emitting layer 172 may include an organic material to emit light of a color. For example, the light emitting layer 172 may include a hole transporting layer, an organic material layer, and an electron transporting layer.

The second light emitting electrode 173 may be formed on the light emitting layer 172. The second light emitting electrode 173 may be formed to cover the light emitting layer 172. The second light emitting electrode 173 may be a common layer commonly formed in the light emitting areas RE, GE, and BE. In an embodiment, a capping layer (not illustrated) may be formed on the second light emitting electrode 173.

In the top emission structure, the second light emitting electrode 173 may be formed of a transparent conductive material (TCO) such as ITO or indium zinc oxide (IZO) capable of transmitting light, or a semi-transmissive conductive material such as magnesium (Mg), silver (Ag), or an alloy of magnesium (Mg) and silver (Ag). In case that the second light emitting electrode 173 is formed of a semi-transmissive conductive material, emission efficiency may be increased by a micro cavity.

An encapsulation layer TFE may be disposed on the second light emitting electrode 173. The encapsulation layer TFE may include at least one inorganic film to prevent oxygen or moisture from permeating into the light emitting element 170. The encapsulation layer TFE may include at least one organic film to protect the light emitting element 170 from foreign substances such as dust. For example, the encapsulation layer TFE may include a first inorganic film TFE1, an organic film TFE2, and a second inorganic film TFE3.

The first inorganic film TFE1 may be disposed on the second light emitting electrode 173, the organic film TFE2 may be disposed on the first inorganic film TFE1, and the second inorganic film TFE3 may be disposed on the organic film TFE2. The first inorganic film TFE1 and the second inorganic film TFE3 may be formed as a multilayer film in which one or more inorganic films of a silicon nitride layer, a silicon oxynitride layer, a silicon oxide layer, a titanium oxide layer, and an aluminum oxide layer are alternately stacked each other. The organic film TFE2 may be formed as an organic film including an acrylic resin, an epoxy resin, a phenolic resin, a polyamide resin, or a polyimide resin.

Figure 9:
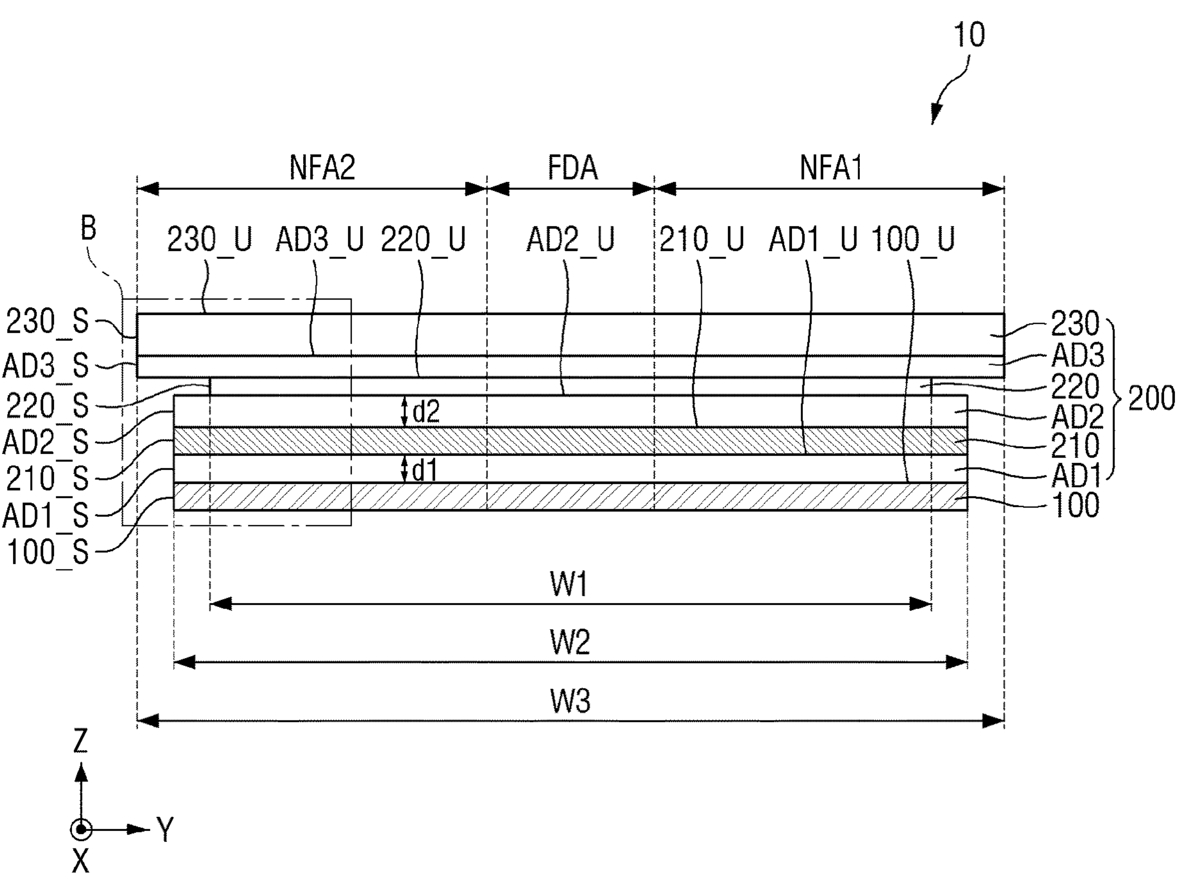
FIG. 9 is a schematic cross-sectional view illustrating a cross-section of a display panel and a front stacked structure according to an embodiment.
Figure 10:
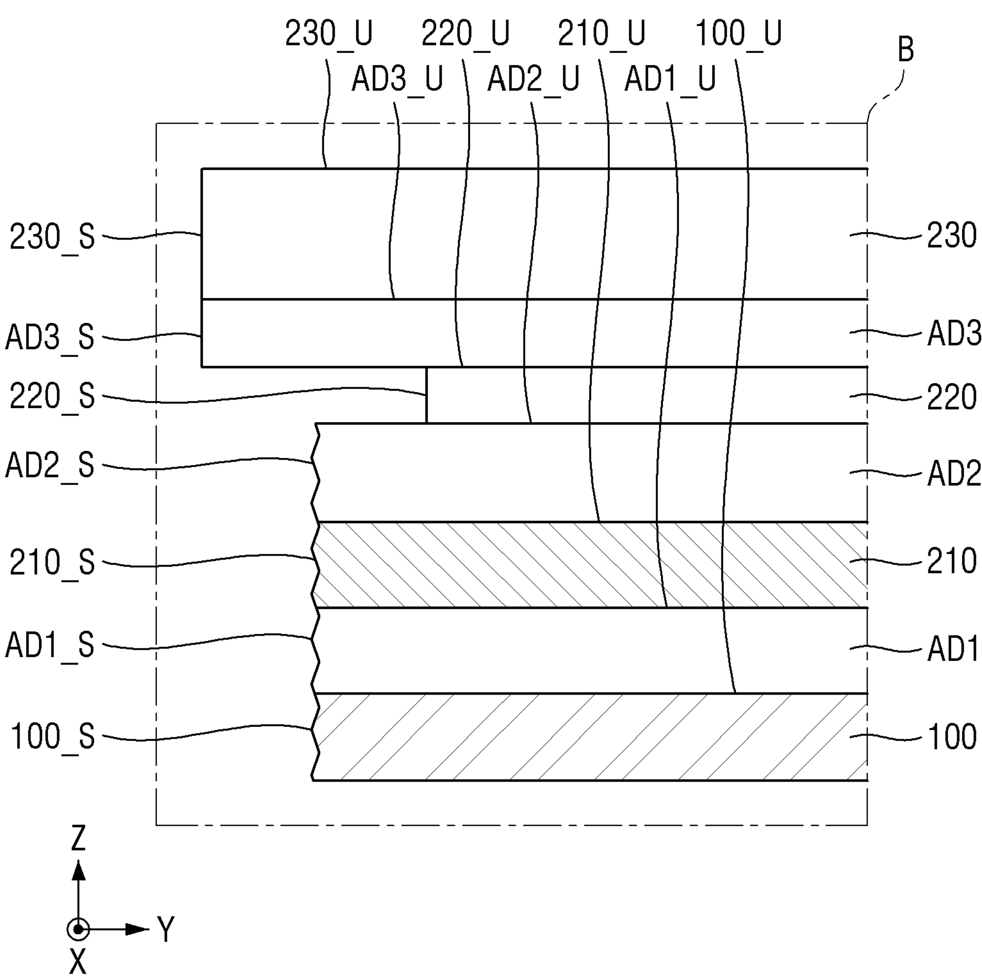
FIG. 10 is an enlarged view of area B of FIG. 9 according to an embodiment.

FIG. 9 is a schematic cross-sectional view illustrating a cross-section of a display panel and a front stacked structure according to an embodiment. FIG. 10 is an enlarged view of area B of FIG. 9 according to an embodiment.

Referring to FIG. 9, as described above, the first adhesive member AD1, the polarizing film 210, the second adhesive member AD2, the window 220, the third adhesive member AD3, and the protective film 230 may be sequentially disposed on the display panel 100.

The window 220 may have a first width W1 in the second direction (Y-axis direction), the display panel 100, the first adhesive member AD1, the polarizing film 210, and the second adhesive member AD2 may have a second width W2 in the second direction (Y-axis direction), and the third adhesive member AD3 and the protective film 230 may have a third width W3 in the second direction (Y-axis direction). The first width W1 may be less than the second width W2, and the second width W2 may be less than the third width W3. Therefore, side surfaces of the layers having different widths may be aligned at different boundaries.

For example, since the display panel 100, the first adhesive member AD1, the polarizing film 210, and the second adhesive member AD2 have a same second width W2 in the second direction (Y-axis direction), a side surface 100_S of the display panel 100, a side surface AD1_S of the first adhesive member AD1, and a side surface 210_S of the polarizing film 210 may be aligned at a same boundary.

Therefore, the second adhesive member AD2 may be disposed between the window 220 and the polarizing film 210 and may entirely cover an upper surface of the polarizing film 210. Accordingly, the second adhesive member AD2 may couple the window 220 and the polarizing film 210 and may prevent foreign substances from being introduced into a lower portion of the second adhesive member AD2.

Since the third adhesive member AD3 and the protective film 230 have a same third width W3 in the second direction (Y-axis direction), a side surface AD3_S of the third adhesive member AD3 and a side surface 230_S of the protective film 230 may be aligned at a same boundary.

The side surface 100_S of the display panel 100, the side surface AD1_S of the first adhesive member AD1, and the side surface 210_S of the polarizing film 210 may be aligned to protrude further in the second direction (Y-axis direction) than the side surface 220_S of the window 220, and the side surface AD3_S of the third adhesive member AD3 and the side surface 230_S of the protective film 230 may be aligned to protrude further in the second direction (Y-axis direction) than the side surface 100_S of the display panel 100, the side surface AD1_S of the first adhesive member AD1, and the side surface 210_S of the polarizing film 210.

The first adhesive member AD1 may have a first thickness d1 in the third direction (Z-axis direction), for example, in the thickness direction of the display device 10, and the second adhesive member AD2 may have a second thickness d2 in the third direction (Z-axis direction).

In an embodiment, the thickness d2 of the second adhesive member AD2 having a surface in direct contact with the window 220 and another surface in direct contact with the polarizing film 210 may be in a range of about 25 μm to about 75 μm. In case that the thickness of the second adhesive member AD2 is greater than or equal to about 25 μm, it is possible to sufficiently secure a mitigation force against an external force generated in case that the display device 10 is folded, and in case that the thickness of the second adhesive member AD2 is less than or equal to about 75 μm, it is possible to prevent cracks in the second adhesive member AD2 or the layers in contact with the second adhesive member AD2 while securing an elastic force in case that the display device 10 is folded. However, the thickness d2 of the second adhesive member AD2 is not limited to the above-described numerical range.

In an embodiment, the thickness d1 of the first adhesive member AD1 may be in a range of about 25 μm to about 75 μm. In an embodiment, the first adhesive member AD1 and the second adhesive member AD2 may have a same thickness. For example, the first thickness d1 and the second thickness d2 may be the same. However, the disclosure is not limited thereto, and in another embodiment, the first thickness d1 and the second thickness d2 may be different from each other. However, even in case that the first thickness d1 and the second thickness d2 are different from each other, each of the first thickness d1 and the second thickness d2 may satisfy the above-described numerical range.

In an embodiment, an elastic modulus of the second adhesive member AD2 at a low temperature (for example, −20° C.) may be in a range of about 0.05 Mpa to about 0.15 Mpa. In an embodiment, in case that the second adhesive member AD2 has the elastic modulus value greater than or equal to about 0.05 Mpa at a low temperature, the second adhesive member AD2 may maintain sufficient adhesive strength with the layers in direct contact with the second adhesive member AD2, and in case that the second adhesive member AD2 has the elastic modulus value less than or equal to about 0.15 Mpa at a low temperature, the second adhesive member AD2 may absorb folding stress generated in case that the display device 10 is folded, thereby preventing cracks from occurring in the second adhesive member AD2. However, the elastic modulus value of the second adhesive member AD2 at a low temperature is not limited to the above-described numerical range.

In an embodiment, the first adhesive member AD1 may have the same elastic modulus value at a low temperature (−20° C.) as that of the second adhesive member AD2. However, the disclosure is not limited thereto, and in another embodiment, the first adhesive member AD1 may have an elastic modulus value at a low temperature different from that of the second adhesive member AD2.

In an embodiment, the second adhesive member AD2 may include an ultraviolet light absorber. The ultraviolet light absorber may absorb ultraviolet light (UV) having a wavelength band in a range of about 300 nm to about 380 nm.

The ultraviolet light absorber may be a light-absorbing dye that absorbs light. For example, the ultraviolet light absorber may include benzotriazole, benzophenone, salicylic acid, salicylate, cyanoacrylate, cinnamate, oxanilide, polystyrene, polyferrocenylsilane, methine, azomethine, triazine, para-aminobenzoic acid, cinnamic acid, an urocanic acid-based light-absorbing dye, or a combination thereof. However, the disclosure is not limited thereto.

In an embodiment, in case that the second adhesive member AD2 includes an ultraviolet light absorber, the ultraviolet light absorber may constitute about 5 wt % based on 100 wt % of a total weight of an adhesive resin included in the second adhesive member AD2. For example, the ultraviolet light absorber may constitute in a range of about 0.1 wt % to about 5 wt % of total weight of the adhesive resin included in the second adhesive member AD2. For example, the ultraviolet light absorber may constitute in a range of about 0.1 wt % to about 3 wt % of total weight of the adhesive resin included in the second adhesive member AD2. However, the ultraviolet light absorber is not limited to the above-described numerical range.

In case that the ultraviolet light absorber constitutes greater than or equal to about 0.1 wt % of total weight of the adhesive resin, it is possible to sufficiently secure an ultraviolet light blocking rate of the adhesive member AD2 including the ultraviolet light absorber, and in case that the ultraviolet light absorber constitutes less than or equal to about 5.0 wt % of total weight of the adhesive resin, it is possible to secure reliability of folding of the display device 10 in case that the second adhesive member AD2 is used as an adhesive member of the display device 10.

In an embodiment, the first adhesive member AD1 disposed on a lower side of the second adhesive member AD2 may not include the ultraviolet light absorber. For example, since the first adhesive member AD1 is in direct contact with the display panel 100, and light generated from the display panel 100 needs to transmit through the first adhesive member AD1 to reach the second adhesive member AD2, a light transmittance of the first adhesive member AD1 may be relatively higher than that of the second adhesive member AD2. However, the disclosure is not limited thereto. In some embodiments, like the second adhesive member AD2, the first adhesive member AD1 may include an ultraviolet light absorber. In case that the first adhesive member AD1 includes an ultraviolet light absorber, the ultraviolet light absorber included in the first adhesive member AD1 may be different from the ultraviolet light absorber included in the second adhesive member AD2, or a ratio thereof may be lower than a ratio of the ultraviolet light absorber included in the second adhesive member AD2.

In an embodiment, the second adhesive member AD2 including the ultraviolet light absorber may block light in a wavelength band in a range of about 300 nm to about 380 nm.

For example, a light transmittance of the second adhesive member AD2 in the wavelength band in a range of about 300 nm to about 380 nm may be less than 6%. A light transmittance of the second adhesive member AD2 at a wavelength of about 380 nm may be in a range of about 6% to about 30%.

In case that a light transmittance of the second adhesive member AD2 is less than about 6% in the wavelength band in a range of about 300 nm to about 380 nm, reliability of the second adhesive member AD2 may be secured. For example, in case that a ratio of the ultraviolet light absorber included in the second adhesive member AD2 is adjusted so that the light transmittance of the second adhesive member AD2 is less than about 6% in the wavelength band in a range of about 300 nm to about 380 nm, the second adhesive member AD2 included in the display device 10 may maintain an adhesive force while folded, thereby preventing a buckling phenomenon that may occur in case that the display device 10 is folded. In case that the light transmittance of the second adhesive member AD2 is less than about 6% in the wavelength band in a range of about 300 nm to about 380 nm, it is possible to prevent a residue of the second adhesive member AD2 from being generated on a cut surface of the second adhesive member AD2 in a process of cutting the second adhesive member AD2 using an ultraviolet (UV) laser. Accordingly, a release film (see 'PL' in FIG. 16) may be smoothly removed from the second adhesive member AD2 after laser cutting. A detailed description thereof will be described below with reference to Table 1 and FIG. 16.

In case that the second adhesive member AD2 has a light transmittance in a range of about 6% to about 30% at a wavelength of about 380 nm, reliability of the second adhesive member AD2 may be secured as in the case in which the light transmittance of the second adhesive member AD2 is less than about 6% in the wavelength band in a range of about 300 nm to about 380 nm. For example, in case that the ratio of the ultraviolet light absorber included in the second adhesive member AD2 is adjusted so that the light transmittance of the second adhesive member AD2 is in a range of about 6% to about 30% at the wavelength of about 380 nm, the adhesive force of the second adhesive member AD2 may be maintained, and a process after the laser cutting process may be smoothly performed.

However, the light transmittance of the second adhesive member AD2 in a specific wavelength band is not limited to the above-described numerical range.

In an embodiment, the light transmittance of the first adhesive member AD1 in the wavelength band in a range of about 300 nm to about 380 nm may be in a range of about 4% to about 90%. For example, as described above, in an embodiment, since the first adhesive member AD1 needs to have a relatively higher light transmittance than the second adhesive member AD2, the first adhesive member AD1 may have a relatively high light transmittance compared to the second adhesive member AD2 as the first adhesive member AD1 does not include an ultraviolet light absorber. Accordingly, in case that an ultraviolet laser is irradiated to another surface of the display panel 100 in the process of cutting the second adhesive member AD2 using the ultraviolet laser, the reliability of the process may be improved by improving the transmittance of the ultraviolet laser transmitting through the first adhesive member AD1 so that the ultraviolet laser may transmit through the first adhesive member AD1 and be absorbed by the second adhesive member AD2.

However, the disclosure is not limited thereto, and in some embodiments, the first adhesive member AD1 may include an ultraviolet light absorber, like the second adhesive member AD2. However, even in case that the first adhesive member AD1 includes an ultraviolet light absorber, the light transmittance of the first adhesive member AD1 may be higher than that of the second adhesive member AD2. For example, by making the ratio of the ultraviolet light absorber included in the first adhesive member AD1 lower than the ratio of the ultraviolet light absorber included in the second adhesive member AD2, the light transmittance of the first adhesive member AD1 may be adjusted to be higher than the light transmittance of the second adhesive member AD2.

In another embodiment, in case that the ratio of the ultraviolet light absorber included in the first adhesive member AD1 and the ratio of the ultraviolet light absorber included in the second adhesive member AD2 are adjusted to be the same, the light transmittance of the first adhesive member AD1 and the light transmittance of the second adhesive member AD2 may be the same. For example, the light transmittance of the first adhesive member AD1 and the light transmittance of the second adhesive member AD2 in the specific wavelength band described above may be the same.

In an embodiment, the second adhesive member AD2 may have a light transmittance greater than or equal to about 80% in a wavelength band of a visible light region in a range of about 400 nm to about 800 nm. For example, the second adhesive member AD2 may have a light transmittance in a range of about 80% to about 95% in the wavelength band of the visible light region in a range of about 400 nm to about 800 nm. However, the light transmittance of the second adhesive member AD2 in the wavelength band of the visible light region in a range of about 400 nm to about 800 nm is not limited to the above-described numerical range.

In case that the second adhesive member AD2 has the light transmittance of greater than or equal to about 80%, the second adhesive member AD2 may be disposed on the front surface of the display panel 100 to improve reliability of the display device 10.

For example, as the second adhesive member AD2 disposed on the front surface of the display panel 100 in the direction in which the screen is displayed has high transmittance in the wavelength band of the visible light region, the transmittance of light having a wavelength in the visible light region generated from the light emitting layer (see '172' in FIG. 8) of the display panel 100 may increase. Accordingly, luminance of the display device 10 may be improved, and thus the display device 10 having improved reliability may be provided to the user.

In an embodiment, the first adhesive member AD1 disposed on the front surface of the display panel 100 may also have the same light transmittance range in the same wavelength band, similarly to the second adhesive member AD2. In another embodiment, the first adhesive member AD1 may have a higher light transmittance than that of the second adhesive member AD2 in a wavelength band in a range of about 400 nm to about 800 nm.

Referring further to FIGS. 9 and 10, a surface roughness of the side surface 100_S of the display panel 100, the side surface AD1_S of the first adhesive member AD1, the side surface 210_S of the polarizing film 210, and the side surface AD2_S of the second adhesive member AD2 may be different from a surface roughness of the side surface 220_S of the window 220 and a surface roughness of the side surface AD3_S of the third adhesive member AD3 and the side surface 230_S of the protective film 230.

For example, the side surface 100_S of the display panel 100, the side surface AD1_S of the first adhesive member AD1, the side surface 210_S of the polarizing film 210, and the side surface AD2_S of the second adhesive member AD2 may have a first surface roughness, the side surface 220_S of the window 220 may have a second surface roughness, and the side surface AD3_S of the third adhesive member AD3 and the side surface 230_S of the protective film 230 may have a third surface roughness.

Since the display panel 100, the first adhesive member AD1, the polarizing film 210, and the second adhesive member AD2 may be simultaneously cut in the cutting process using a laser, the side surface 100_S of the display panel 100, the side surface AD1_S of the first adhesive member AD1, the side surface 210_S of the polarizing film 210, and the side surface AD2_S of the second adhesive member AD2 may have a same first surface roughness.

The side surface 100_S of the display panel 100, the side surface AD1_S of the first adhesive member AD1, the side surface 210_S of the polarizing film 210, and the side surface AD2_S of the second adhesive member AD2 may be cut surfaces cut by a laser beam in a cutting process using a laser to be described below. Therefore, as illustrated in FIG. 10, the side surface 100_S of the display panel 100, the side surface AD1_S of the first adhesive member AD1, the side surface 210_S of the polarizing film 210, and the side surface AD2_S of the second adhesive member AD2 may have curves formed by a laser in the cutting process using the laser, and thus may have a same first surface roughness.

Since upper surfaces 100_U, AD1_U, 210_U, and AD2_U of the display panel 100, the first adhesive member AD1, the polarizing film 210, and the second adhesive member AD2, respectively, are not in direct contact with the laser in the cutting process using the laser, the upper surfaces 100_U, AD1_U, 210_U, and AD2_U of each of the first adhesive member AD1, the polarizing film 210, and the second adhesive member AD2 may have relatively smooth surfaces compared to the side surfaces 100_S, AD1_S, 210_S, and AD2_S of the display panel 100, the first adhesive member AD1, the polarizing film 210, and the second adhesive member AD2, respectively. For example, a surface roughness of the upper surface of the second adhesive member AD2 may be less than the first surface roughness.

The second surface roughness of the side surface 220_S of the window 220 and the third surface roughness of the side surface AD3_S of the third adhesive member AD3 and the side surface 230_S of the protective film 230 may have a relatively smooth surface compared to the first surface roughness of the side surfaces 100_S, AD1_S, 210_S, and AD2_S of the display panel 100, the first adhesive member AD1, the polarizing film 210, and the second adhesive member AD2, respectively. For example, since the side surface 220_S of the window 220, the side surface AD3_S of the third adhesive member AD3, and the side surface 230_S of the protective film 230 are cut by a different cutting process from that of the side surfaces 100_S, AD1_S, 210_S, and AD2_S of the display panel 100, the first adhesive member AD1, the polarizing film 210, and the second adhesive member AD2, respectively, the side surface 220_S of the window 220, the side surface AD3_S of the third adhesive member AD3, and the side surface 230_S of the protective film 230 may have surface roughness different from that of the side surfaces 100_S, AD1_S, 210_S, and AD2_S of the display panel 100, the first adhesive member AD1, the polarizing film 210, and the second adhesive member AD2.

Since the side surface AD3_S of the third adhesive member AD3 and the side surface 230_S of the protective film 230 are cut in a state in which the third adhesive member AD3 and the protective film 230 are bonded, the side surface AD3_S of the third adhesive member AD3 and the side surface 230_S of the protective film 230 may have a same third surface roughness.

Since the window 220 is cut through a process step separate from the third adhesive member AD3 and the protective film 230, the side surface 220_S of the window 220 may have the second surface roughness different from the first surface roughness and the third surface roughness.

Although it is illustrated in FIG. 10 that the side surface 220_S of the window 220, the side surface AD3_S of the third adhesive member AD3, and the side surface 230_S of the protective film 230 have a relatively smooth surface compared to the side surfaces 100_S, AD1_S, 210_S, and AD2_S of the display panel 100, the first adhesive member AD1, the polarizing film 210, and the second adhesive member AD2, respectively, the side surface 220_S of the window 220, the side surface AD3_S of the third adhesive member AD3, and the side surface 230_S of the protective film 230 may also include a curve, like the side surfaces 100_S, AD1_S, 210_S, and AD2_S of the display panel 100, the first adhesive member AD1, the polarizing film 210, and the second adhesive member AD2, respectively, according to a process method of cutting each of the window 220, the third adhesive member AD3, and the protective film 230 in some embodiments. Accordingly, the second surface roughness and the third surface roughness may be greater than the first surface roughness.

Although it is illustrated in FIG. 10 that the roughness of the side surface 220_S of the window 220 is the same as the roughness of the upper surface 220_U of the window 220, the upper surface 220_U of the window 220 may have a relatively smooth surface compared to the side surface 220_S of the window 220 because the upper surface 220_U of the window 220 is not a cut surface like the upper surfaces 100_U, AD1_U, 210_U, and AD2_U of the first adhesive member AD1, the polarizing film 210, and the second adhesive member AD2, respectively. Similarly, the upper surfaces AD3_U and 230_U of the third adhesive member AD3 and the protective film 230, respectively, may also have relatively smooth surfaces compared to the side surfaces AD3_S and 230_S of the third adhesive member AD3 and the protective film 230, respectively.

Hereinafter, a method of manufacturing a display device 10 will be described with reference to FIGS. 11 to 17.

Figure 11:
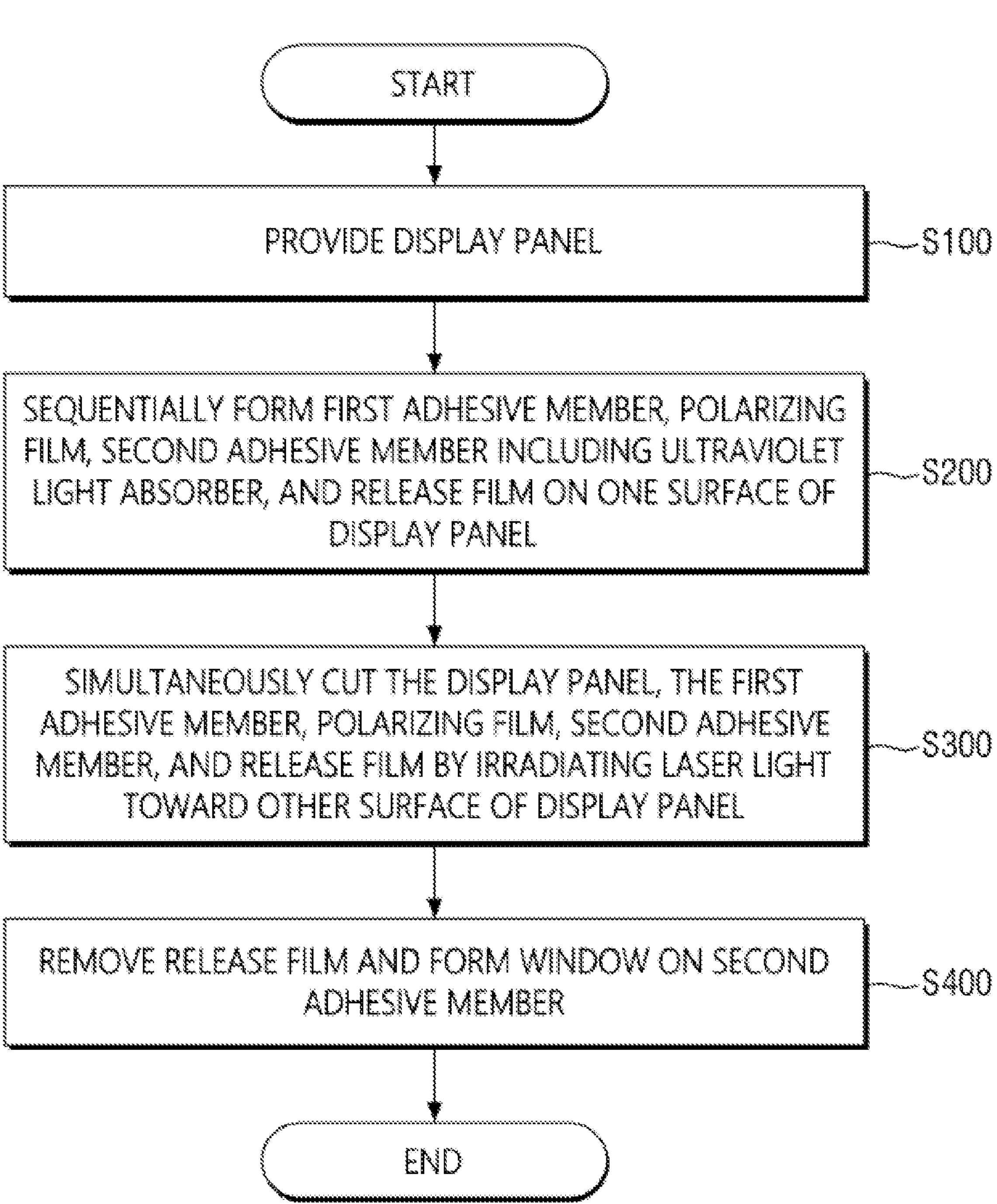
FIG. 11 is a flowchart of a method of manufacturing a display device according to an embodiment.

FIG. 11 is a flowchart of a method of manufacturing a display device according to an embodiment. FIGS. 12 to 17 are views illustrating steps of the method of manufacturing a display device according to an embodiment.

Referring to FIG. 11, a method of manufacturing a display device 10 according to an embodiment may include a step (S100) of proving a display panel, a step (S200) of sequentially forming a first adhesive member, a polarizing film, a second adhesive member including an ultraviolet light absorber, and a release film on a surface of the display panel, a step (S300) of simultaneously cutting the display panel, the first adhesive member, the polarizing film, the second adhesive member, and the release film by irradiating laser light toward another surface of the display panel, and a step (S400) of removing the release film and forming a window on the second adhesive member.

The method of manufacturing the display device 10 is not limited to the above-described example, and at least some of the steps may be omitted or the method of manufacturing the display device 10 may further include at least one other step with reference to other descriptions of the specification.

Hereinafter, a method of manufacturing a display device 10 will be described in detail with further reference to FIGS. 12 to 17.

Figure 12:
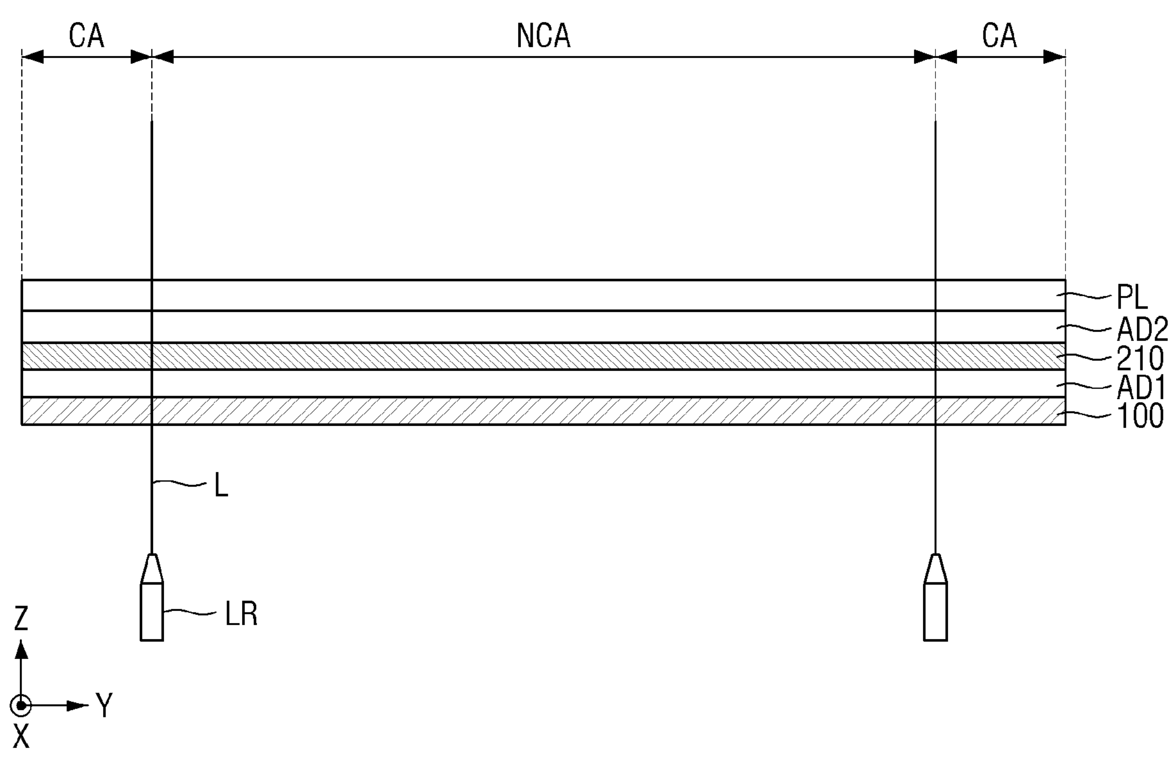
FIGS. 12 to 17 are views illustrating steps of the method of manufacturing a display device according to an embodiment.

Referring to FIG. 12, the display panel 100 provided in the step (S100) of providing the display panel 100 may be substantially the same as the display panel 100 having the cross-sectional structure illustrated in FIG. 8. A first adhesive member AD1, a polarizing film 210, a second adhesive member AD2, and a release film PL may be sequentially formed on a surface of the display panel 100 (S200).

In the step (S200) of sequentially forming the first adhesive member AD1, the polarizing film 210, the second adhesive member AD2, and the release film PL on the surface of the display panel 100, the first adhesive member AD1, the polarizing film 210, the second adhesive member AD2, and the release film PL may be sequentially formed on the surface of the display panel 100 by various methods.

The release film PL, which is a protective paper for preventing contamination and external contact of the second adhesive member AD2, may be removed before the window 220 is attached to a surface of the second adhesive member AD2, and after the release film PL is removed, the window 220 may be attached to the surface of the second adhesive member AD2.

In an embodiment, the release film PL may be a plastic film made of polyimide (PI), polyethyleneterephthalate (PET), polyethylene naphthalate (PEN), polyethersulfone (PES), nylon, polytetrafluoroethylene (PTFE), polyether ether ketone (PEEK), polycarbonate (PC), and/or polyarylate. However, the disclosure is not limited thereto.

Figure 13:
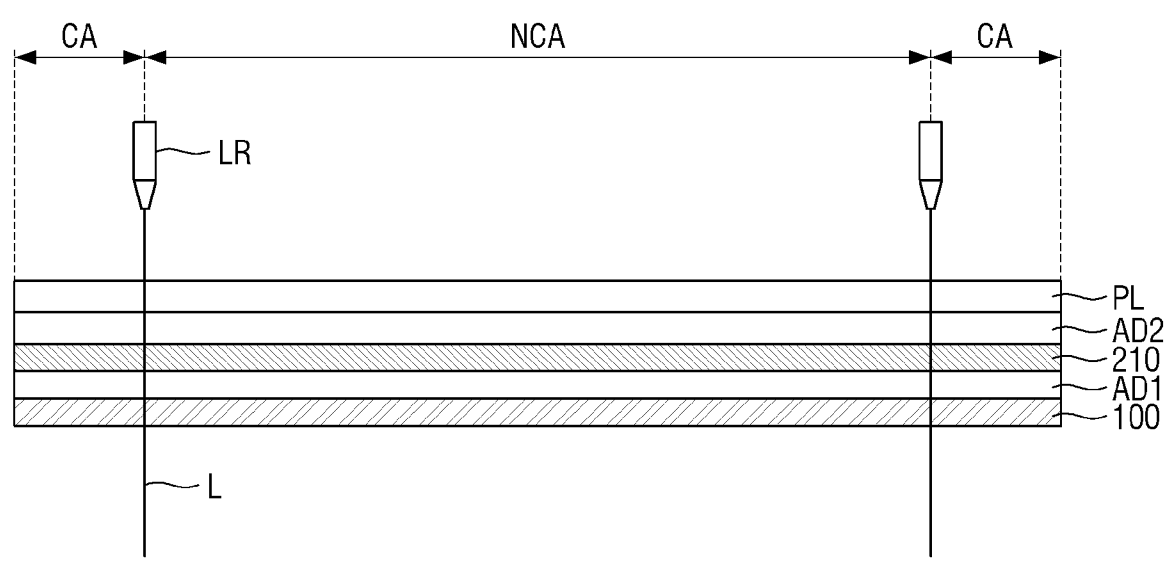
Figure 13:
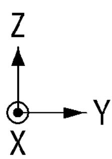

Referring to FIGS. 12 and 13, each of the display panel 100, the first adhesive member AD1, the polarizing film 210, the second adhesive member AD2, and the release film PL may include a cut area CA that is cut by laser light L irradiated by a laser device LR and a non-cut area NCA.

As illustrated in FIG. 12, the laser light L may be incident on another surface of the display panel 100. The laser light L may travel in the third direction (Z-axis direction). In other words, the laser light L may travel from a lower surface of the display panel 100 toward an upper surface of the release film PL. However, the incident direction of the laser light L is not limited thereto. For example, as illustrated in FIG. 13, the laser light L may be incident on the upper surface of the release film PL, and the laser light L may travel from an upper surface of the release film PL toward another surface of the display panel 100.

In an embodiment, the laser light L generated by the laser device LR may be laser light L having a wavelength in the ultraviolet (UV) region. In case that the laser light L has a wavelength in the ultraviolet region, the laser light L may have a wavelength band in a range of, for example, about 340 nm to about 360 nm. However, the wavelength band of the laser light L is not limited to the above-described numerical range.

Figure 14:
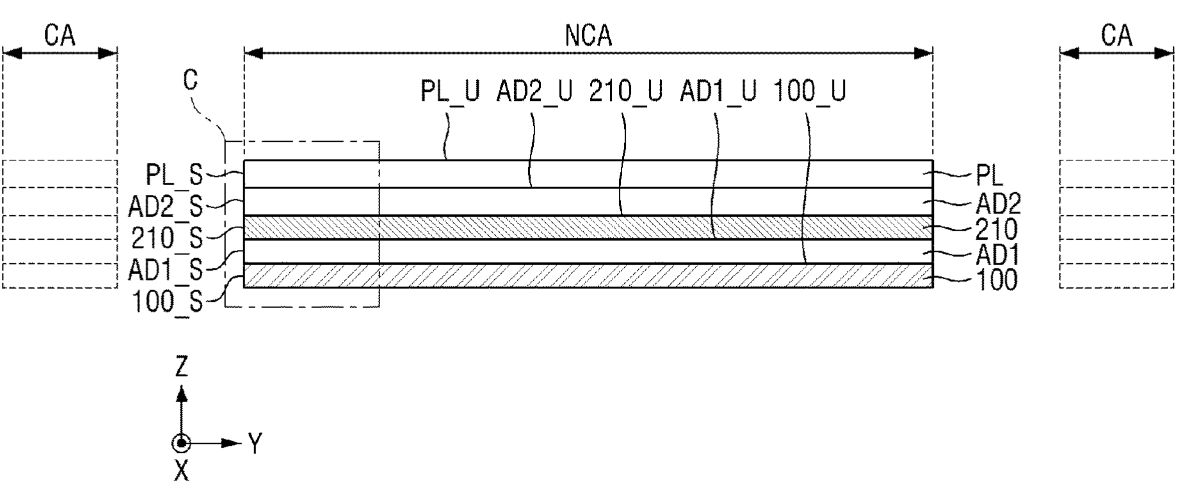
Figure 15:
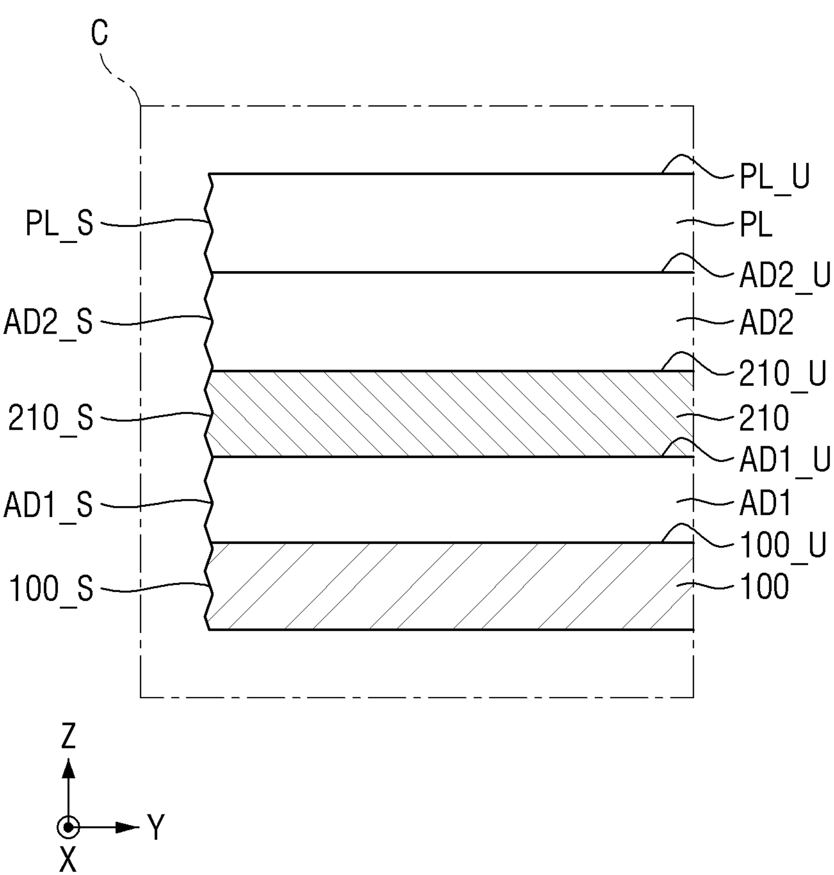

FIG. 14 is a schematic cross-section view illustrating a state in which the display panel 100, the first adhesive member AD1, the polarizing film 210, the second adhesive member AD2, and the release film PL are cut by the laser light L. FIG. 15 is an enlarged view of area C of FIG. 14.

Referring to FIGS. 14 and 15, a portion of the display panel 100, the first adhesive member AD1, the polarizing film 210, the second adhesive member AD2, and the release film PL may be simultaneously cut. For example, side surfaces 100_S, AD1_S, 210_S, AD2_S, and PL_S of the display panel 100, the first adhesive member AD1, the polarizing film 210, the second adhesive member AD2, and the release film PL formed by the laser cutting process may be connected to each other to form one side surface. For example, the cut areas CA spaced apart from each other in the second direction (Y-axis direction) with the non-cut area NCA disposed therebetween may be simultaneously cut, and a boundary between the non-cut area NCA and the cut area CA may become a cut surface of the display panel 100, the first adhesive member AD1, the polarizing film 210, the second adhesive member AD2, and the release film PL, for example, the side surfaces 100_S, AD1_S, 210_S, AD2_S, and PL_S of the display panel 100, the first adhesive member AD1, the polarizing film 210, and the release film PL.

Referring to FIG. 15, as described above, the side surface 100_S of the display panel 100, the side surface AD1_S of the first adhesive member AD1, the side surface 210_S of the polarizing film 210, the side surface AD2_S of the second adhesive member AD2, and the side surface PL_S of the release film PL may have curves formed in the process of being cut by the laser light L, and accordingly, the side surfaces 100_S, AD1_S, 210_S, AD2_S, and PL_S of the display panel 100, the first adhesive member AD1, the polarizing film 210, the second adhesive member AD2, and the release film PL, respectively, may have a same surface roughness.

Since the upper surfaces 100_U, AD1_U, 210_U, AD2_U, and PL_U of the display panel 100, the first adhesive member AD1, the polarizing film 210, the second adhesive member AD2, and the release film PL, respectively, do not contact the laser light L, the upper surfaces 100_U, AD1_U, 210_U, AD2_U, and PL_U of the display panel 100, the first adhesive member AD1, the polarizing film 210, the second adhesive member AD2, and the release film PL, respectively, may maintain a smooth surface.

Figure 16:
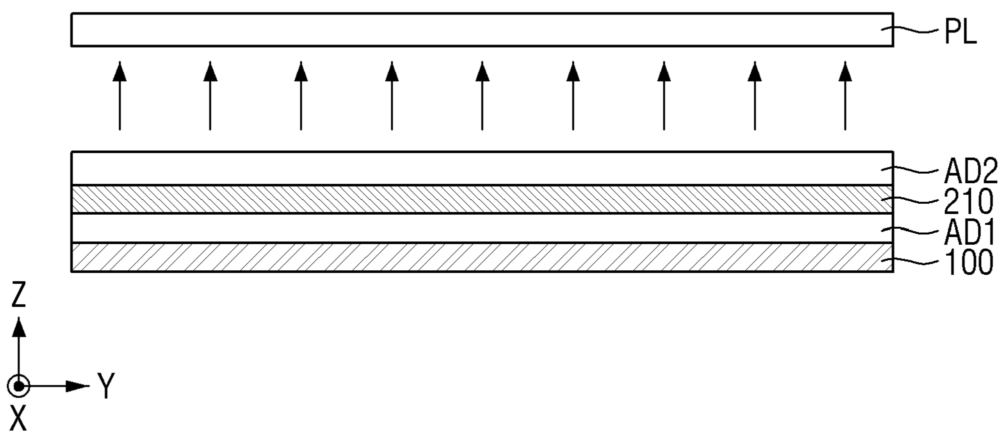
Figure 17:
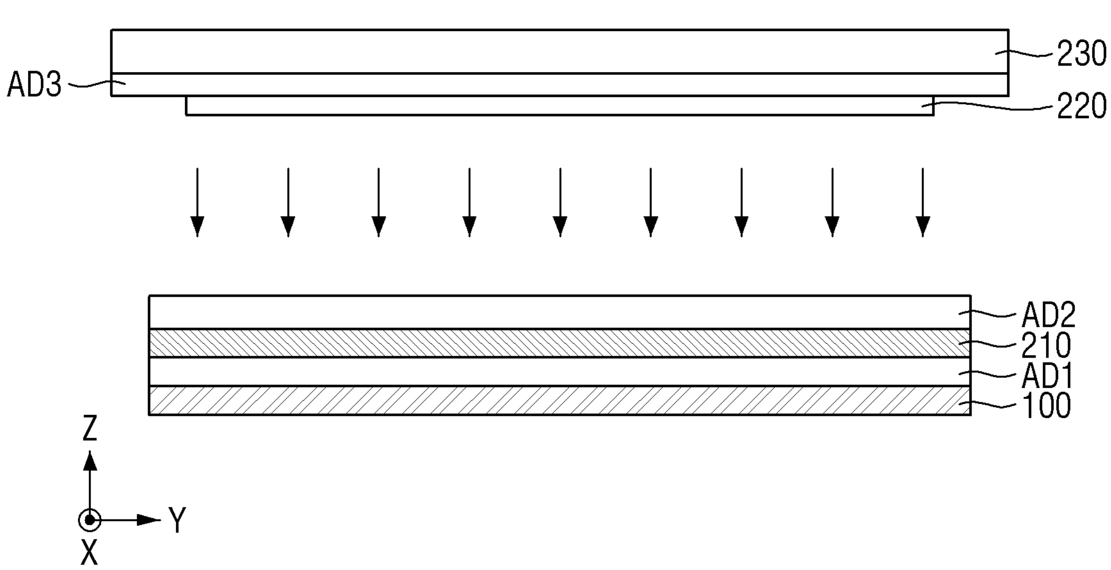

Referring to FIGS. 16 and 17, the release film PL may be removed, and a window 220 may be formed on the second adhesive member AD2 (S400). In the step (S300) of simultaneously cutting the display panel 100, the first adhesive member AD1, the polarizing film 210, the second adhesive member AD2, and the release film PL, since the second adhesive member AD2 including the ultraviolet light absorber may block light in a wavelength band in a range of about 300 nm to about 380 nm, the second adhesive member AD2 may be cut with no residue of the second adhesive member AD2 remaining on the side surface AD_2 of the second adhesive member AD2 in case that the second adhesive member AD2 is cut with ultraviolet laser light L having a wavelength band in a range of about 340 nm to about 360 nm. Accordingly, the process of removing the release film PL from the second adhesive member AD2 may be smoothly performed.

The protective film 230 may be attached on a surface of the window 220 by the third adhesive member AD3, and a lamination process may be performed so that an upper surface of the second adhesive member AD2 and another surface of the window 220 are in contact with each other. In this process, the third adhesive member AD3 and the protective film 230 may be attached to a surface of the window 220 in a state in which they are bonded.

Hereinafter, embodiment will be described in more detail by comparing some Experimental Examples.

[Table 1]

TABLE 1

| Classification | | Example 1 | Example 2 | Example 3 | Example 4 | Comparative Example 1 | Comparative Example 2 | Comparative Example 3 |
|---|---|---|---|---|---|---|---|---|
| Transmittance (%) of UV Light | 300 nm or more and less than 310 nm | 0 | 0 | 0 | 0 | 0 | 0 | 4 |
| | 310 nm or more and less than 320 nm | 0 | 0 | 0 | 0 | 0 | 0 | 21 |
| | 320 nm or more and less than 330 nm | 0 | 0 | 0 | 0 | 0 | 0 | 45 |
| | 330 nm or more and less than 340 nm | 0 | 0 | 0 | 0 | 0 | 0 | 67 |
| | 340 nm or more and less than 350 nm | 0 | 0 | 0 | 0 | 0 | 0 | 80 |
| | 350 nm or more and less than 360 nm | 0 | 0 | 0 | 0 | 0 | 0 | 87 |
| | 360 nm or more and less than 370 nm | 0.1 | 0 | 0 | 0 | 0 | 0 | 90 |
| | 370 nm or more and less than 380 nm | 3 | 0.3 | 0.2 | 0.1 | 0 | 0 | 90 |
| | 380nm | 30 | 15 | 10 | 6 | 4 | 0.1 | 90 |
| Standard Substrate Adhesion | | ○ | ○ | ○ | ○ | Δ | Δ | ○ |
| Processing Property | Success Rate of Delamination after Later Cutting | 100% | 100% | 100% | 100% | 100% | 100% | 57% |
| Transmittance (%) of Visible Light | 400 nm or more and 800 nm or less | 90 | 88 | 88 | 80 | 80 | 72 | 91 |

Referring to Table 1 above, values obtained by experimenting and comparing the reliability of the process such as a light transmittance, reliability of adhesion, a success rate of delamination in a process step after cutting using a laser, and the like in the wavelength bands of ultraviolet light of Examples and Comparative Examples are shown.

Examples 1 to 4 and Comparative Examples 1 and 2 correspond to the second adhesive member AD2 including the ultraviolet light absorber, and Comparative Example 3 corresponds to the second adhesive member AD2 that does not include the ultraviolet light absorber. The reliability of adhesion of Examples and Comparative Examples is expressed as standard substrate adhesion, and in case that the second adhesive member AD2 corresponding to Examples and Comparative Examples secures reliability as an adhesive member, it was indicated by 'O', and in case that the second adhesive member AD2 corresponding to Examples and Comparative Examples does not secure reliability as an adhesive member, it was indicated by 'Δ'.

The processing property indicates a success rate of delamination in case that the second adhesive member AD2 and the release film PL disposed on the second adhesive member AD2 are cut using the laser light having the ultraviolet wavelength band, and the release film PL is removed from the second adhesive member AD2, as described above.

Comparative Example 3 corresponding to the second adhesive member AD2 that does not include the ultraviolet light absorber was indicated by '0' in that a problem in reliability of adhesion does not occur because as the wavelength increases, the light transmittance generally increases and the second adhesive member AD2 that does not include the ultraviolet light absorber does not change in physical properties.

However, in the case of Comparative Example 3 corresponding to the second adhesive member AD2 that does not include the ultraviolet light absorber, a reliability problem may occur in the processing property. For example, as described above, in case that the second adhesive member AD2 and the release film PL disposed on a surface of the second adhesive member AD2 and in direct contact with the surface of the second adhesive member AD2 are simultaneously cut with the laser light having the ultraviolet light wavelength band, density of laser light absorbed by the second adhesive member AD2 may be reduced because the second adhesive member AD2 has a high light transmittance as illustrated in Table 1, and accordingly, the release film PL may be bonded to a residue of the second adhesive member AD2 remaining on the cut surface of the second adhesive member AD2, thereby reducing a delamination probability of the release film PL. Therefore, in Comparative Example 3 that does not include the ultraviolet light absorber, the success rate of delamination of the release film PL after the cutting process using the laser is as low as 57%.

Therefore, the second adhesive members AD2, which satisfy the standard substance adhesion and at the same time satisfy the reliability in the process step, were tested by Examples and Comparative Examples. Hereinafter, Examples 1 to 4 and Comparative Examples 1 and 2 will be described in detail together with Table 1.

Each of Examples 1 to 4 and Comparative Examples 1 and 2 was tested by varying a content ratio of the ultraviolet light absorber included in the second adhesive member AD2.

For example, as illustrated in Table 1, since each of Examples 1 to 4 and Comparative examples 1 and 2 includes the ultraviolet light absorber, the light transmittance in all wavelength bands was decreased as compared with Comparative Example 3.

Referring to Table 1, in the wavelength band of 380 nm, the light transmittance of Example 1 is the highest, and the light transmittance of Comparative Example 2 is the lowest. This means that the second adhesive member AD2 of Example 1 has the highest content of the ultraviolet light absorber, and the second adhesive member AD2 of Comparative Example 2 has the lowest content of the ultraviolet light absorber.

In the wavelength band of 300 nm or more and less than 380 nm, each of Examples 1 to 4 and Comparative Examples 1 and 2 has a light transmittance of less than 6%. For example, except that Example 1 has a light transmittance of 0.1% in the wavelength band of 360 nm or more and less than 370 nm, each of Examples 1 to 4 and Comparative Examples 1 and 2 has a light transmittance of 0% in a wavelength band of 300 nm or more and less than 370 nm. For example, in the wavelength band of 300 nm or more and less than 370 nm, it may be seen that the light transmittance is 0% regardless of a difference in the ratio of the ultraviolet light absorber included in the second adhesive member AD2.

In a wavelength band of 370 nm or more and less than 380 nm, Examples 1 to 4 have a light transmittance of 0.1% or more and 3% or less, and each of Comparative Examples 1 and 2 has a light transmittance of 0%. This means that there is a difference in light transmittance as Examples 1 to 4 include a relatively low ultraviolet light absorber compared to Comparative Examples 1 and 2.

At a wavelength of 380 nm, Examples 1 to 4 have a light transmittance of 6% or more and 30% or less, and Comparative Example 1 and Comparative Example 2 have a light transmittance of 4% and a light transmittance of 0.1%, respectively. For example, it may be seen that Examples 1 to 4 have an increased light transmittance in the wavelength band of 370 nm or more, and Comparative Examples 1 and 2 have an increased light transmittance at the wavelength of 380 nm. This also means that there is a difference in light transmittance as Examples 1 to 4 include a relatively low ultraviolet light absorber compared to Comparative Examples 1 and 2 as described above.

In case that the ratio of the ultraviolet light absorber included in the second adhesive member AD2 is adjusted so that Examples 1 to 4 have a light transmittance of less than 6% in the wavelength band of 300 nm or more and less than 380 nm, and have a light transmittance of 6% or more and 30% or less at the wavelength of 380 nm, Examples 1 to 4 may satisfy both the reliability of adhesion and the reliability in the process step as illustrated in [Table 1]. For example, as illustrated in Table 1, Examples 1 to 4 are all indicated by '0' in the standard substrate adhesion, and show a success rate of delamination of 100% in the process of simultaneously cutting the second adhesive member AD2 and the release film PL using the laser and removing the release film PL from the second adhesive member AD2.

In the case of Comparative Examples 1 and 2, the ratio of the ultraviolet light absorber included in the second adhesive member AD2 was adjusted so that Comparative Examples 1 and 2 have a light transmittance of less than 6% in the wavelength band of 300 nm or more and 380 nm or less compared to Examples 1 to 4. Accordingly, as illustrated in Table 1, each of Comparative Examples 1 and 2 satisfies the reliability in the process step, but does not satisfy the reliability of adhesion. In other words, this means that reliability of adhesion of the second adhesive member AD2 is not secured in case that the content of the ultraviolet light absorber is adjusted so that the second adhesive member AD2 has a light transmittance of 0% in the wavelength band of 300 nm or more and less than 380 nm and has a light transmittance of less than 6% at the wavelength of 380 nm.

Therefore, in case that the content of the ultraviolet light absorber is adjusted so that the second adhesive member AD2 including the ultraviolet light absorber has a light transmittance of less than 6% in the wavelength band of 300 nm or more and less than 380 nm and has a light transmittance of 6% or more and 30% or less at the wavelength of 380 nm, the reliability of the adhesion force of the second adhesive member AD2 may be secured, and the reliability of process property may be improved after the process step using the ultraviolet laser.

A light transmittance in a wavelength band of 400 nm or more and 800 nm or less in a visible light region of Examples 1 to 4 and Comparative Examples 1 and 2 will be described with reference to Table 1. As described above, as Examples 1 to 4 and Comparative Examples 1 and 2 include the ultraviolet light absorber, the light transmittance of the second adhesive member AD2 in a wavelength band of a visible light region may vary.

For example, as illustrated in Table 1, Examples 1 to 4 and Comparative Examples 1 and 2 show a low light transmittance in a wavelength band of 400 nm or more and 800 nm or less which is a visible light region, compared to Comparative example 3 that does not include the ultraviolet light absorber.

It may be seen that the light transmittance in the visible light region of Example 1, in which the content of the ultraviolet light absorber is the highest, is the highest, and the light transmittance in the visible light region of Comparative Example 2, in which the content of the ultraviolet light absorber is the lowest, is the lowest.

However, as in Examples 1 to 4, in case that the light transmittance of the second adhesive member AD2 attached to the front surface of the display panel in the visible light wavelength band is 80% or more, reliability such as luminance of the display device 10 may be secured as the second adhesive member AD2 sufficiently transmits light in the visible light region generated from the light emitting layer of the display device 10.

Comparative Example 1 shows the light transmittance in the wavelength band of the visible light region of 80%, but does not secure the reliability of the second adhesive member AD2 as described above, and Comparative Example 2 does not satisfy both the light transmittance and the reliability of adhesion in the visible light wavelength band.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display panel including a first surface and a second surface opposite to the first surface;

a polarizing member disposed on the first surface of the display panel;

a window member disposed on the polarizing member; and a first adhesive member disposed between the window member and the polarizing member and including an ultraviolet light absorber, wherein a side surface of the display panel, a side surface of the polarizing member, and a side surface of the first adhesive member have a first surface roughness, an upper surface of the first adhesive member has a second surface roughness less than the first surface roughness, and the side surface of the display panel, the side surface of the polarizing member, and the side surface of the first adhesive member are aligned at a boundary.

2. The display device of claim 1, wherein a light transmittance of the first adhesive member is less than or equal to about 6% in a wavelength band in a range of about 300 nm to about 380 nm.

3. The display device of claim 2, wherein the light transmittance of the first adhesive member is in a range of about 6% to about 30% at a wavelength of about 380 nm.

4. The display device of claim 3, wherein the light transmittance of the first adhesive member is greater than or equal to about 80% in a wavelength band in a range of about 400 nm to about 800 nm.

5. The display device of claim 1, wherein the ultraviolet light absorber includes benzotriazole, benzophenone, salicylic acid, salicylate, cyanoacrylate, cinnamate, oxanilide, polystyrene, polyferrocenylsilane, methine, azomethine, triazine, para-aminobenzoic acid, cinnamic acid, an urocanic acid-based light-absorbing dye, or a combination thereof.

6. The display device of claim 1, wherein an elastic modulus of the first adhesive member at −20° C. is in a range of about 0.05 MPa to about 0.15 MPa.

7. The display device of claim 1, wherein a thickness of the first adhesive member in a thickness direction of the display panel is in a range of about 25 μm to about 75 μm.

8. The display device of claim 3, further comprising:

a second adhesive member disposed between the polarizing member and the display panel, wherein a side surface of the second adhesive member has the first surface roughness and is aligned with the side surface of the display panel, the side surface of the polarizing member, and the side surface of the first adhesive member at the boundary.

9. The display device of claim 8, wherein a light transmittance of the second adhesive member is higher than the light transmittance of the first adhesive member.

10. The display device of claim 8, further comprising:

a protective member disposed on the window member; and a third adhesive member disposed between the protective member and the window member, wherein a side surface of the third adhesive member has a third surface roughness less than the first surface roughness.

11. The display device of claim 10, wherein the side surface of the third adhesive member is aligned at a boundary different from the boundary the side surface of the first adhesive member and the side surface of the second adhesive member are aligned.

* * * * *